US012431371B2

(12) United States Patent
Cho

(10) Patent No.: US 12,431,371 B2
(45) Date of Patent: Sep. 30, 2025

(54) SEMICONDUCTOR CHIP DELAMINATION DEVICE AND CONTROL METHOD THEREFOR

(71) Applicant: ENGION CO., LTD., Cheongju-si (KR)

(72) Inventor: Jae Won Cho, Cheongju-si (KR)

(73) Assignee: DOOSAN TESNA INC., Pyeongtaek-si (KR)

( * ) Notice: Subject to any disclaimer, the term of this patent is extended or adjusted under 35 U.S.C. 154(b) by 140 days.

(21) Appl. No.: 17/916,992

(22) PCT Filed: May 20, 2021

(86) PCT No.: PCT/KR2021/006269
§ 371 (c)(1),
(2) Date: Oct. 4, 2022

(87) PCT Pub. No.: WO2021/241935
PCT Pub. Date: Dec. 2, 2021

(65) Prior Publication Data
US 2023/0162997 A1 May 25, 2023

(30) Foreign Application Priority Data

May 25, 2020 (KR) .................. 10-2020-0062520
May 25, 2020 (KR) .................. 10-2020-0062521

(51) Int. Cl.
*H01L 21/67* (2006.01)
*H01L 21/02* (2006.01)
*H01L 21/683* (2006.01)

(52) U.S. Cl.
CPC .. *H01L 21/67132* (2013.01); *H01L 21/02079* (2013.01); *H01L 21/6836* (2013.01); *H01L 2221/6839* (2013.01)

(58) Field of Classification Search
CPC ............. B32B 43/006; H01L 21/67017; H01L 21/67253; H01L 21/67; H01L 21/683;
(Continued)

(56) References Cited

U.S. PATENT DOCUMENTS

2007/0087475 A1* 4/2007 Kanazawa .......... H01L 21/6835
438/106
2008/0023133 A1* 1/2008 Yamamoto ........ H01L 21/67132
156/716
(Continued)

FOREIGN PATENT DOCUMENTS

JP   2013118406 A * 6/2013
JP   2014049485 A * 3/2014 ....... H01L 21/67132
(Continued)

OTHER PUBLICATIONS

Machine Translation of Chul, Espacenet, 2007 (generated Oct. 30, 2024) (Year: 2007).*
(Continued)

*Primary Examiner* — Andrew L Swanson
(74) *Attorney, Agent, or Firm* — Rabin & Berdo, P.C.

(57) ABSTRACT

The present invention provides a semiconductor chip delamination device for peeling off a protective film attached to one surface of a semiconductor chip, including: a stage unit (400) configured to allow a ring frame, in which the semiconductor chip having the protective film attached thereto is disposed, to be seated thereon; a delamination feeding unit (300) configured to feed a delamination seal contactable with the protective film so as to peel off the protective film from the semiconductor chip; a covering unit (500, 600) configured to allow the delamination seal to cover the semiconductor chip such that the delamination seal comes into close contact with the protective film; and a delaminating unit (700) configured to peel off, from the semiconductor chip, the delamination seal disposed to cover
(Continued)

the semiconductor chip having the protective film disposed on one surface thereof, and provides a method of controlling the semiconductor chip delamination device.

33 Claims, 17 Drawing Sheets

(58) Field of Classification Search
CPC .......... H01L 21/67132; H01L 21/6836; H01L 21/68327; H01L 21/68381
See application file for complete search history.

(56) References Cited

U.S. PATENT DOCUMENTS

| | | | |
|---|---|---|---|
| 2011/0067808 A1* | 3/2011 | Nishio | C09J 133/10 156/247 |
| 2013/0081764 A1* | 4/2013 | Yamanaka | C09J 7/22 428/40.2 |

FOREIGN PATENT DOCUMENTS

| | | | | |
|---|---|---|---|---|
| KR | 20070038727 | A | * | 4/2007 |
| KR | 1020070038727 | A | | 4/2007 |
| KR | 1020070041403 | A | | 4/2007 |
| KR | 1020070117506 | A | | 12/2007 |
| KR | 1020080012184 | A | | 2/2008 |
| KR | 1020110023811 | A | | 3/2011 |
| KR | 1020130112779 | A | | 10/2013 |
| KR | 1020140029229 | A | | 3/2014 |
| KR | 1020150050395 | A | | 5/2015 |
| KR | 1020160024752 | A | | 3/2016 |
| KR | 101707805 | B1 | | 2/2017 |
| KR | 1020190057326 | A | | 5/2019 |

OTHER PUBLICATIONS

Machine Translation of Kiuchi, Espacenet, 2014 (generated Oct. 30, 2024) (Year: 2014).*
Machine Translation of Takano, Espacenet, 2013 (generated Oct. 30, 2024) (Year: 2013).*

* cited by examiner

SEMICONDUCTOR CHIP DELAMINATION DEVICE AND CONTROL METHOD THEREFOR

TECHNICAL FIELD

The present invention relates to a semiconductor chip manufacturing device and control method thereof, and more particularly, to a semiconductor chip delamination device and control method thereof, which can prevent contamination of or damage to a semiconductor chip during a semiconductor chip manufacturing process.

BACKGROUND ART

Hundreds, thousands, or hundreds or thousands of semiconductor chips are formed on a semiconductor wafer manufactured through a semiconductor manufacturing process. The semiconductor wafer is attached to an adhesive tape mounted on a ring frame while being put into a packaging process, and is cut into individual chip units through a sawing process.

The semiconductor chips formed on the semiconductor wafer are classified into good products, defective products, or grades. The semiconductor chips subjected to the classification process are transferred to a separate tape (hereinafter referred to as 'mounting tape') having an adhesive strength and rearranged thereon. As such, a technique in which the classified semiconductor chips are rearranged in the form of a wafer is referred to as 'reconstruction'.

A conventional method of manufacturing a semiconductor chip is as follows.

First, a protective film or tape is laminated on an active surface of a semiconductor wafer. Thereafter, a back grinding process can be performed on the back surface of the semiconductor wafer so as to provide a thin semiconductor chip, if necessary. Then, the semiconductor wafer is mounted on a ring frame such that the back surface thereof comes into close contact with an adhesive tape disposed on the ring frame whose central portion is opened. Subsequently, the protective tape is removed from the semiconductor wafer, which is in turn sawn into individual chips, and then the individual semiconductor chips are transferred to and rearranged on the mounting tape for each classified type. In this case, the individual semiconductor chips are picked up by the pickup tool and transferred from the adhesive tape to the mounting tape. The thus reconstructed semiconductor chips are put into the packaging process.

However, in the conventional semiconductor chip manufacturing method, foreign substances such as silicon residues (dust) and particles scattered during the sawing process are easily adsorbed on the surface of the semiconductor chip. In addition, since the pickup tool comes into direct contact with the semiconductor chip to pick up the semiconductor chip, the surface of the semiconductor chip is likely to be scratched or damaged by the pickup tool. The adsorption of foreign substances on the surface of the semiconductor chip or the damage to the surface of the semiconductor chip leads to product defects, thus resulting in a reduction in the product yield.

Various approaches have been proposed to solve this problem, but there have been challenges that are difficult to overcome in industrial facilities that constitute a series of continuous processes for mass production.

(Patent Document 1): Korean Patent No. 1707805 (Feb. 17, 2017)

DISCLOSURE OF INVENTION

Technical Problem

Accordingly, the present invention has been made to solve the above-mentioned problems occurring in the prior art, and it is an object of the present invention to provide a semiconductor chip delamination device which can perform a faster, easier and reliable process of peeling off a protective film or a protective tape attached to protect a semiconductor chip from a semiconductor wafer irrespective of either a process of sawing the semiconductor wafer into individual semiconductor chips or a process of transferring the sawn individual semiconductor chips from the semiconductor wafer to a mounting tape and rearranging the chips on the mounting tape, and a method of controlling the same.

Technical Solution

To achieve the above object, in one aspect, the present invention provides a semiconductor chip delamination device for peeling off a protective film attached to one surface of a semiconductor chip, including: a stage unit (400) configured to allow a ring frame, in which the semiconductor chip having the protective film attached thereto is disposed, to be seated thereon; a delamination feeding unit (300) configured to feed a delamination seal contactable with the protective film so as to peel off the protective film from the semiconductor chip; a covering unit (500, 600) configured to allow the delamination seal to cover the semiconductor chip such that the delamination seal comes into close contact with the protective film; and a delaminating unit (700) configured to peel off, from the semiconductor chip, the delamination seal disposed to cover the semiconductor chip having the protective film disposed on one surface thereof.

In the semiconductor chip delamination device, the covering unit (500, 600) may include a pre-laminating unit (500) configured to press the delamination seal while moving relative to the delamination seal that the delamination seal comes into close contact with the protective film.

In the semiconductor chip delamination device, the pre-laminating unit (500) may be a roller type.

In the semiconductor chip delamination device, the pre-laminating unit (500) may include: a pre-laminating frame (550) disposed spaced apart from the stage unit (400); and a pre-laminating pressing part (510) disposed at the pre-laminating frame (550) in such a manner as to be movable relative to the pre-laminating frame (550), and the pre-laminating pressing part (510) may include a rotating structure.

In the semiconductor chip delamination device, the pre-laminating pressing part (510) may include: a pre-laminating pressing roller (511) configured to be able to come into direct contact with a heat seal; a pre-laminating pressing frame (513) disposed so as to be movable relative to the pre-laminating frame (550) such that the pre-laminating pressing roller (511) is rotatable relative to the pre-laminating pressing frame (513); and a pre-laminating pressing actuator (560) disposed at one side thereof on the pre-laminating frame (550) and connected at the other side thereof to the pre-laminating pressing frame (513) to provide a driving force to drive the pre-laminating pressing roller (511).

In the semiconductor chip delamination device, the pre-laminating unit (500) may include a pre-laminating heat seal guide (520) fixedly disposed at the pre-laminating frame (550) in such a manner as to be spaced apart from the pre-laminating pressing part (510) and configured to guide the heat seal therealong.

In the semiconductor chip delamination device, the pre-laminating heat seal guide (520) may include: a pre-laminating heat seal guide roller (521) configured to be able to come into direct contact with the heat seal to guide the heat therealong; and a pre-laminating heat seal guide holder (523) connected at one end thereof to the pre-laminating heat seal guide roller (521) and connected at the other end thereof to the pre-laminating frame (550).

In the semiconductor chip delamination device, the pre-laminating unit (500) may further include a pre-laminating transfer part (540) configured to transfer the pre-laminating pressing part (510) of the pre-laminating unit (500) in a horizontal direction so as to be movable relative to the stage unit (400).

In the semiconductor chip delamination device, the pre-laminating transfer part (540) may include: a pre-laminating transfer lead screw (545) disposed spaced apart from the stage unit (400) in such a manner as to be connected at one end thereof to the pre-laminating frame (550); a pre-laminating transfer lead block (543) configured to move along the longitudinal direction of the pre-laminating transfer lead screw (545); and a pre-laminating transfer lead actuator (547) configured to apply a rotational force to the pre-laminating transfer lead screw (545).

In the semiconductor chip delamination device, the pre-laminating unit (500) may further include a pre-laminating pressing heater (530) disposed at the pre-laminating pressing part (510).

In the semiconductor chip delamination device, the pre-laminating unit (500) may be a blade type.

In the semiconductor chip delamination device, the covering unit (500, 600) may include a heating laminating unit (600) configured to thermally press the delamination seal such that the delamination seal comes into bonding contact with the protective film.

In the semiconductor chip delamination device, the heating laminating unit (600) may include: a heating laminating body (610) configured to be movable relative to the stage unit (400); and a heating laminating heater (620) disposed at the heating laminating body (610) to transmit heat to the heat seal.

In the semiconductor chip delamination device, the heating laminating body (610) may directly contact and press the heat seal.

In the semiconductor chip delamination device, the delaminating unit (700) may include: a delaminating unit body (710) disposed spaced apart from the stage unit (400); a delaminating unit peeler guide (720) disposed at one end thereof at the delaminating unit body (710) such that a free end of the delaminating unit peeler guide (720) is positioned in a relative movement direction between the stage unit (400) and the delaminating unit body (710); and a delaminating unit peeler guide (730) disposed at the delaminating unit body (710) so as to be located at a region opposite to the free end of the delaminating unit filler blade (720) when projected to a plane on which the stage unit (400) is disposed.

In the semiconductor chip delamination device, the delaminating unit (700) may include: a delamination transfer part (740) configured to transfer the unit so as to be movable relative to the stage unit (400).

In the semiconductor chip delamination device, the delamination transfer part (740) may include: a delamination transfer guide (743) disposed spaced apart from the stage unit (400); a delamination transfer block (741) configured to allow the delaminating unit body (710) to be connectedly disposed on one surface thereof and move along the longitudinal direction of the delamination transfer guide (743); and a delamination transfer actuator (745) configured to apply a moving force to the delamination transfer block (741).

In the semiconductor chip delamination device, the delamination feeding unit (300) may include: a feeding unit trailing winder (310) configured to allow one end of the delamination seal to be connected thereto; and a feeding unit leading winder (320) configured to allow the other end of delamination seal to be connected thereto and operate in cooperation with the feeding unit trailing winder 310 to allow the delamination seal to be wound thereon.

In the semiconductor chip delamination device, the semiconductor chip delamination device may further include a UV irradiator (800) configured to irradiate an ultraviolet ray to the delamination seal that contactingly covers the protective film by the covering unit (500,600).

In the semiconductor chip delamination device, the semiconductor chip delamination device may further include a cleaning unit (900) configured to clean one surface of the semiconductor chip from which the delamination seal has been peeled off.

In the semiconductor chip delamination device, the semiconductor chip delamination device may include: a sensing unit (50) configured to detect the operation state of at least one of the stage unit (400), the delamination feeding unit (300), the covering unit (500, 600), and the delaminating unit (700), and the state of the delamination seal; and a control unit (20) configured to apply a control signal to the stage unit (400), the delamination feeding unit (300), the covering unit (500, 600), and the delaminating unit (700) based on a sensing signal from the sensing unit (50) and preset data stored in a storage unit.

In the semiconductor chip delamination device, the stage unit 400 may include: a stage plate (420) configured to allow the ring frame to be seated thereon; a stage base (410) configured to allow the stage plate (420) to be seated thereon; a stage base shaft (430) configured to rotate the stage plate (420); and a stage base lifter (440) seatingly connected at one end to the stage base (420) to lift stage plate (420).

In the semiconductor chip delamination device, the covering unit may include a heating laminating unit (600a) configured to thermally bond the delamination seal to the protective film using high frequency such that the delamination seal comes into bonding contact with the protective film.

In the semiconductor chip delamination device, the covering unit may include a heating laminating unit (600b) configured to thermally bond the delamination seal to the protective film using a high heat infrared ray such that the delamination seal comes into bonding contact with the protective film.

In another aspect, the present invention provides a method of controlling a semiconductor chip delamination device for peeling off a protective film attached to one surface of a semiconductor chip, the method including: a provision step (S1) of providing a semiconductor chip delamination device (10) including: a sensing unit (50) configured to detect the operation state of a stage unit (400), a delamination feeding unit (300), a covering unit (500, 600), and a delaminating unit (700), and the state of the delamination seal; and a control unit (20) configured to apply a control signal to the stage unit (400), the delamination feeding unit (300), the covering unit (500, 600), and the delaminating unit (700) based on a sensing signal from the sensing unit (50) and preset data stored in a storage unit; a stage seating step (S10) of allowing a ring frame, in which the semiconductor chip having the protective film attached thereto is disposed, to be seated on the stage unit (400); a covering step (S20) of allowing the delamination seal to cover the semiconductor chip such that the delamination seal comes into close contact with the protective film; and a delaminating step (S30) of peeling off, from the semiconductor chip, the delamination seal disposed to cover the semiconductor chip having the protective film disposed on one surface thereof.

In the control method of a semiconductor chip delamination device, the covering step (S20) may include: a feeding step (S21) of allowing the control unit (20) to control the delamination seal to be fed to a corresponding position of the ring frame: a pre-laminating step (S23) of allowing the delamination seal to come into pressingly contact with the protective film attached to the top surface of the semiconductor chip disposed at the ring frame through the pre-laminating unit (500) of the covering unit (500, 600); and a heating laminating step (S25) of allowing the delamination seal to come into thermally melting contact with the protective film attached to the top surface of the semiconductor chip disposed at the ring frame through the heating laminating unit (600) of the covering unit (500, 600).

In the control method of a semiconductor chip delamination device, the feeding step (S21) may include: a feeding start step (S211) of allowing the control unit (20) to control the delamination feeding unit (300) to feed the delamination seal contactable with the protective film to peel off the protective film from the semiconductor chip; a tension detection and position confirmation step (S213) of allowing a tension sensor (51) of the sensing unit (50) to detect a tension applied to the delamination seal, and check the moving position of the delamination seal; a tension comparison step (S215) of allowing the control unit (20) to compare the tension (P) applied to the delamination seal with a preset tension PS of the preset data stored in the storage unit (30); and a position comparison step (S217) of allowing the control unit (20) to compare the moving position of the delamination seal with a preset position SS of the preset data stored in the storage unit (30).

In the control method of a semiconductor chip delamination device, if it is determined in the tension comparison step (S215) by the control unit (20) that the tension detected is more than the preset tension, the control unit (20) may determine that the tension of the delamination seal is abnormal to allow the control flow to proceed to an emergency response step S219.

In the control method of a semiconductor chip delamination device, the pre-laminating step (S23) may include: a pre-laminating pressing part arrangement step (S233) of allowing the pre-laminating unit (500) to be arranged on the semiconductor chip disposed at the ring frame seated on the stage unit (400); and a pre-laminating pressing part movement step (S235) of allowing the delamination seal to come into pressingly contact with the protective film attached to the top surface of the semiconductor chip disposed at the ring frame by moving a pre-laminating pressing part (510) of the pre-laminating unit (500).

In the control method of a semiconductor chip delamination device, the pre-laminating step (S23) may include a pre-laminating position confirmation step (S231) of allowing a position sensor (53) of the sensing unit (50) to check the position of the pre-laminating unit (500).

In the control method of a semiconductor chip delamination device, the pre-laminating pressing part movement step (S235) may include: a pre-laminating pressing part pressing movement step (S2351) of allowing the pre-laminating pressing part (510) of the pre-laminating unit (500) to be vertically moved to cause the pre-laminating pressing part (510) of the pre-laminating unit (500) to come into direct contact with the delamination seal; a base pressure detection step (S2353) of allowing a plurality of pressure sensors (55) of the sensing unit (50) to detect a pressure applied to the protective film attached to the top surface of the semiconductor chip disposed at the ring frame through the delamination seal by the pre-laminating pressing part (510) of pre-laminating unit (500); a pressure uniformity confirmation step (S2355) of checking the uniformity of the detected input values of the pressure sensors (55); and an pressure correction step (S2357) of correcting a pressure difference checked in the pressure uniformity confirmation step (S2355).

In the control method of a semiconductor chip delamination device, the heating laminating step (S25) may include: a heating laminating unit position confirmation step (S251) of allowing a position sensor (53) of the sensing unit (50) to check the position of the heating laminating unit (600); a heating laminating movement step (S253) of moving the heating laminating unit (600) to allow the delamination seal to come into thermally melting contact with the protective film attached to the top surface of the semiconductor chip disposed at the ring frame through the heating laminating unit (600); a pressure and temperature detection step (S255) of allowing a pressure sensor (55) of the sensing unit (50) to detect a pressure applied to the protective film attached to the top surface of the semiconductor chip disposed at the ring frame through the delamination seal, and allowing a temperature sensor (57) of the sensing unit (50) to detect the temperature of the protective film; a pressure comparison step (S257) of comparing a detected pressure value ($P_h$) of the pressure sensor (55) with a preset pressure value ($P_{hs}$) of the preset data stored in the storage unit (30); and a temperature comparison step (S258) of comparing a detected temperature value ($t_h$) of the temperature sensor (57) with a preset pressure value ($t_{hs}$) of the preset data stored in the storage unit (30).

In the control method of a semiconductor chip delamination device, the delaminating step (S30) may include: a delaminating unit movement step (S31) of allowing the delaminating unit to be moved to peel off, from the semiconductor chip, the delamination seal disposed to cover the semiconductor chip having the protective film disposed on one surface thereof; a delaminating unit peeler blade pressure detection step (S33) of detecting a pressure applied to the delaminating unit peeler blade (720); a pressure uniformity confirmation step (S35) of comparing the pressure detected in the delaminating unit peeler blade pressure detection step (S33) with a preset pressure value of the preset data stored in the storage unit (30); and a pressure correction step (S37) of regulating a pressure applied to the delaminating unit peeler blade.

In the control method of a semiconductor chip delamination device, the semiconductor chip delamination device (10) may further include a UV irradiator (800), and the method may further include, after the covering step (S20), a UV irradiating step (S40) that is executed between the covering step (S20) and the delaminating step (S30), and irradiates an ultraviolet ray onto the delamination seal disposed to cover the semiconductor chip having the protective film disposed on one surface thereof.

In the control method of a semiconductor chip delamination device, the semiconductor chip delamination device (10) may further includes a cleaning unit (900), and the method may further include, after the delaminating step (S30), a cleaning step (S50) of cleaning one surface of the semiconductor chip from which the delamination seal for allowing the protective film in a melting contact state to be separated from the semiconductor chip is peeled off.

Advantageous Effects

The semiconductor chip delamination device and control method thereof according to the embodiments of the present invention as constructed above has the following advantageous effects.

According to the present invention, since a semiconductor wafer sawing process, a semiconductor wafer back grinding process, and a semiconductor chip transferring process are performed in a state in which the semiconductor chip is protected by the protective film, contamination of or damage to the semiconductor chip can be prevented and the protective film can be peeled off from the semiconductor wafer easily regardless of any process.

In addition, according to the present invention, the semiconductor wafer is cut into individual chip units to separate semiconductor chips formed on the semiconductor wafer and then the protective film is peeled off from the semiconductor chips, so that a reduction in the product yield due to contamination of or damage to the semiconductor chips can be avoided and simultaneously process reliability and yield can be improved through a fast peeling-off process.

Besides, according to the present invention, it is possible to satisfy foreign substance management requirements required in the recent semiconductor chip manufacturing process, so that an expensive device additionally installed in the cutting equipment used in the semiconductor wafer sawing process to solve problems such as adsorption of foreign substances on the semiconductor chip or damage to the semiconductor chip can be excluded, the cost of improving the working environment to prevent scattering of foreign substances such as silicon residues and particles can be reduced, and simultaneously the operation and maintenance costs of semiconductor manufacturing facilities through a highly reliable continuous process can be saved.

BEST MODE FOR CARRYING OUT THE INVENTION

Figure 1:
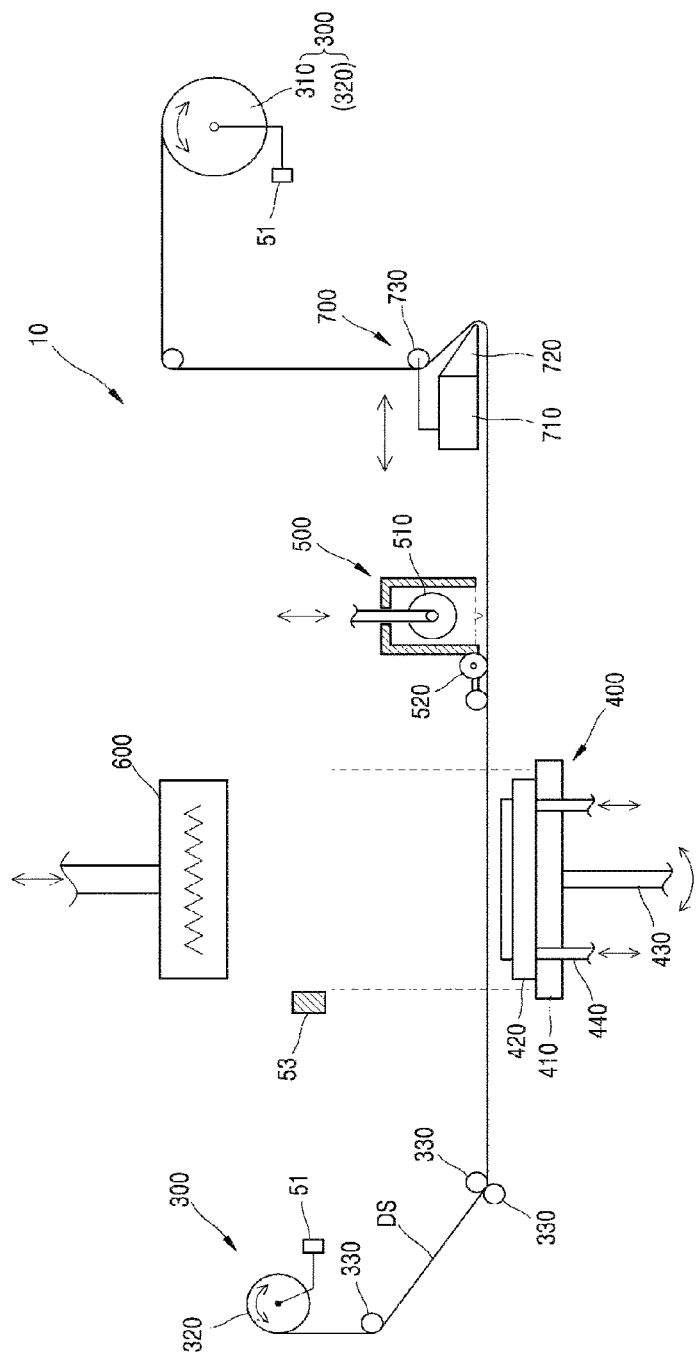
FIG. 1 is a schematic diagrammatic view showing a configuration of a semiconductor chip delamination device according to an embodiment of the present invention.

Hereinafter, a semiconductor chip delamination device and control method thereof according to preferred embodiments of the present invention will be described in detail with reference to the accompanying drawings.

The present invention provides a semiconductor chip delamination device for more easily peeling off a protective film attached to the active surface of a semiconductor wafer so as to protect damage to a semiconductor chip subjected to a back grinding or sawing step in a semiconductor chip manufacturing process, and a control method thereof.

The semiconductor chip delamination device according to an embodiment of the present invention is a device for peeling off a protective film attached to one surface of a semiconductor chip. The semiconductor chip delamination device includes a stage unit 400, a delamination feeding unit 300, a covering unit (500, 600, 600a, 600b), and a delaminating unit 700.

The semiconductor chip according to an embodiment of the present invention is referred to as a semiconductor chip in a state in which a protective film is attached to one surface of an adhesive tape disposed on a ring frame through a process in which the protective film is attached to an active surface of a semiconductor wafer, and the back surface of the semiconductor wafer is back-grinded and/or sawn and/or reconstructed, and a detailed description of a previous process will be omitted in order to clarify the gist of the present invention.

An adhesive tape 140 is disposed on a ring frame 142, a plurality of semiconductor chips 115 are disposed on one surface of the adhesive tape 140, and a protective film 120 is disposed on one surface of each of the semiconductor chips 115.

The ring frame, in which the semiconductor chip having the protective film attached thereto is disposed, is seated on the stage unit 400. The stage unit 400 includes a stage plate 420, a stage base 410, a stage base shaft 430, and a stage base lifter 440.

The stage plate 420 allows the ring frame to be seated thereon, and the stage base 410 allows the stage plate 420 to be seated thereon. In this embodiment, the stage plate 420 has a structure in which the stage plate 420 is seatingly disposed in the stage base 410.

The stage base shaft 430 is configured to be connected at one end thereof to the stage plate 420 to rotate the stage plate 420, and the stage base lifter 440 is configured to be seatingly connected at one end to the stage base 420 to lift stage plate 420. In some embodiments, the stage plate 420 includes a stage plate suction part 421 penetratingly formed therein, and may have a configuration in which it provides a vacuum pressure for more stably holding the ring frame.

Although a constituent element of providing a lifting driving force, such as a hydraulic or electric motor, is connected to the other end of the stage base lifter 440, a detailed description thereof will be omitted in this embodiment.

The delamination feeding unit 300 feeds a delamination seal contactable with the protective film so as to peel off the protective film from the semiconductor chip. In this embodiment, the delamination seal forms a continuum roll structure. In other words, the delamination seal has a configuration in which it is mounted on a constituent element on which one side and the other side thereof are wound respectively or is mounted on the delamination feeding unit 300 of a constituent element one which at least one of the both sides thereof is wound.

In this embodiment, the delamination feeding unit 300 performs a function of forming the winding, movement and tension of the delamination seal having such a continuum roll structure. The delamination feeding unit 300 is further provided to enable to be connected to both ends of the delamination seal. The delamination feeding unit 300 includes a feeding unit trailing winder 310 and a feeding unit leading winder 320.

The feeding unit trailing winder 310 allows one end of the delamination seal to be connected thereto, and the feeding unit leading winder 320 allows the other end of delamination seal to be connected thereto and operates in cooperation with the feeding unit trailing winder 310 to allow the delamination seal to be wound thereon.

The feeding unit trailing winder 310 and the feeding unit leading winder 320 may only partially perform a winding function, but all of them have a winding function so that each of them is connected to a winding motor (not shown) and is driven.

Of course, In some embodiments, as shown in FIG. 1, the delamination feeding unit 300 may further include separate feeding guides 330 for forming the guide and tension of the delamination seal. The feeding guide 330 may be modified in various manners depending on design specifications, such as being implemented as a position fixed structure or a separate movable structure in some case.

Figure 11:
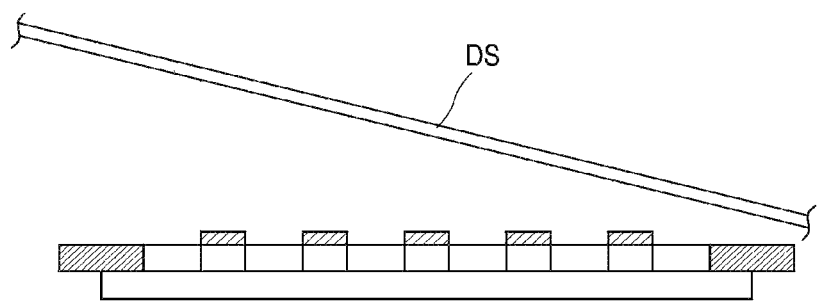
FIGS. 11 to 17 are schematic partial side and enlarged views showing a process of a semiconductor chip delamination device according to an embodiment of the present invention.

As shown in FIG. 11, the delamination seal disposed on the ring frame through the stage unit 400 and the delamination feeding unit 300 is prepared in a state of being contactable with the protective film.

The covering unit (500, 600) allows a delamination seal (DS) to cover the semiconductor chip having the protective film disposed thereon or the semiconductor chip disposed on the ring frame such that the delamination seal comes into close contact with the protective film.

The covering unit (500, 600) may include at least one of a pre-laminating unit 500 and a heating laminating unit 600. In this embodiment, a description has been made focusing on the case where the covering unit includes these both constituent elements. Although such a configuration is preferable in a practical aspect, various modifications may be made depending on design specifications.

Figure 12:
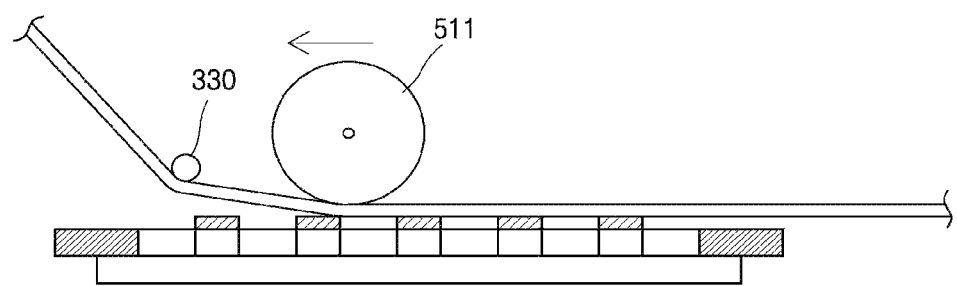
Figure 13:
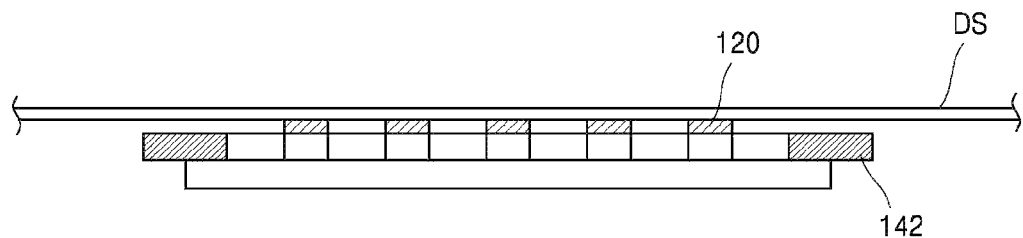

The pre-laminating unit 500 presses the delamination seal (DS) while moving relative to the delamination seal (DS) such that the delamination seal (DS) comes into close contact with the protective film 120. In this embodiment in which the covering unit includes the pre-laminating unit 500 and the heating laminating unit 600, the pre-laminating unit 500 may perform a pre-pressure step of forming a press bonding state. In this embodiment, the pre-laminating unit 500 can be configured in various manners within the scope of providing a pressing force or pressure, and will be described centering on a roller type. In other words, the pre-laminating unit 500 of the present invention may be a roller type. The pre-laminating unit 500 may be a roller type. The pre-laminating unit 500 having a roller type rotating structure includes a pre-laminating frame 550 and a pre-laminating pressing part 510. As shown in FIGS. 12 and 13, the pre-laminating unit 500 presses the delamination seal (DS) while moving relative to the delamination seal (DS) such that the delamination seal (DS) comes into close contact with the protective film 120.

The pre-laminating frame 550 is disposed be spaced apart from the stage unit 400. The pre-laminating frame 550 includes a pre-laminating frame base 551 and a pre-laminating frame body 553. The pre-pre-laminating frame base 551 is connected at one end thereof to a pre-laminating transfer part 540 which will be described later, and is connected at the other end thereof to the pre-laminating frame body 553. A pre-laminating pressing actuator 560 of a pre-laminating pressing part 510 which will be described later is disposed at the pre-laminating frame body 553.

Figure 4:
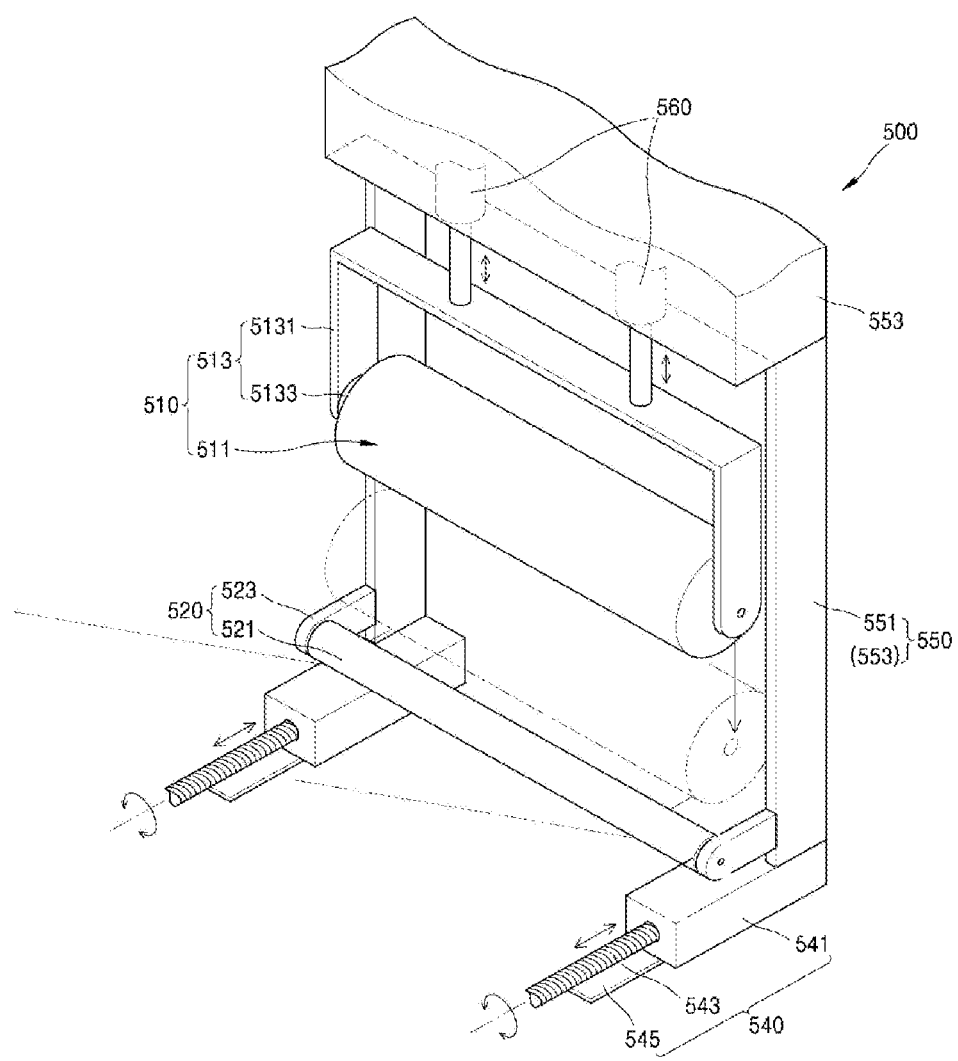
FIG. 4 is a schematic top perspective view showing a pre-laminating unit of a covering unit of a semiconductor chip delamination device according to an embodiment of the present invention.

The pre-laminating pressing part 510 is disposed at the pre-laminating frame 550 in such a manner as to be movable relative to the pre-laminating frame 550. The pre-laminating pressing part 510 at least partially has a rotating structure. As shown in FIG. 4, the pre-laminating pressing part 510 of the rotating structure includes a pre-laminating pressing roller 511, a pre-laminating pressing frame 513, and a pre-laminating pressing actuator 560.

The pre-laminating pressing roller 511 is able to come into direct contact with a heat seal. More specifically, the pre-laminating pressing roller 511 has a cylindrical structure to form a structure that comes into direct contact with the delamination seal (DS) of a continuum structure shape through a rotating operation. The pre-laminating pressing roller 511 is rotatably supported at both ends thereof by the pre-laminating pressing frame 513. The pre-laminating pressing roller 511 may provide power through a driving source such as a separate motor.

The pre-laminating pressing frame 513 is disposed so as to be movable relative to the pre-laminating frame (550) such that the pre-laminating pressing roller (511) is rotatable relative to the pre-laminating pressing frame 513. The pre-laminating pressing frame 513 includes a pre-laminating pressing main frame 5131 and a pre-laminating pressing shaft frame 5133.

The pre-laminating pressing main frame 5131 has a 'L' shape so that the pre-laminating pressing roller 511 is disposed at the inner side thereof, and the pre-laminating pressing shaft frame 5133 forms a structure in which it is connected at one ends thereof to both ends of the pre-laminating pressing roller 511 and connected at the other ends thereof to both ends of the pre-laminating pressing main frame 5131 so that a relative rotation movement between the pre-laminating pressing main frame 5131 and the pre-laminating pressing roller 511 can be achieved.

In the meantime, the pre-laminating pressing actuator 560 serves to provide a driving force to drive the pre-laminating pressing roller 511. The pre-laminating pressing actuator 560 is disposed at one side thereof on the pre-laminating frame 550 and connected at the other side thereof to the pre-laminating pressing frame 513 to provide a driving force to drive the pre-laminating pressing roller 511. Although the pre-laminating pressing actuator 560 uses a linear actuator having a hydraulic cylinder structure in this embodiment, it will be apparent to those skilled in the art that various modifications thereof are possible within the scope of forming a predetermined pressure condition besides hydraulic pressure.

In addition, in this embodiment, the pre-laminating pressing actuator 560 has a configuration in which two elements are disposed spaced apart from each other, which forms a structure that can respond to a change in length depending on design specifications to provide a uniform pressing force so that air bubbles can be prevented from being formed between the delamination seal (DS) and the protective film 120 and the close contactability therebetween can be improved. In some embodiments, a pressure sensor 55 of the sensing unit 50 is disposed at a bottom surface of the stage unit 400, for example, the stage plate 420 to detect whether or not a pressing force is uniformly formed on a contact area along the longitudinal direction of the pre-laminating pressing roller 511. By virtue of this configuration, various modifications can be made, such as having a configuration of achieving the adjustment of the pressing force of the pre-laminating pressing actuator 560.

Meanwhile, the pre-laminating unit 500 may further include a pre-laminating heat seal guide (520). The pre-laminating pressing part 510 has a vertically movable structure whereas the pre-laminating heat seal guide 520 has a relatively fixed structure, but may have a rotating structure In some embodiments. In other words, the pre-laminating heat seal guide 520 is fixedly disposed at the pre-laminating frame 550 in such a manner as to be spaced apart from the pre-laminating pressing part 510 and is configured to guide the heat seal therealong. The pre-laminating heat seal guide 520 includes a pre-laminating heat seal guide roller 521 and a pre-laminating heat seal guide holder 523. The pre-pre-laminating heat seal guide roller 521 is configured to be able to come into direct contact with the heat seal to guide the heat therealong, and the pre-laminating heat seal guide holder 523 is connected at one end thereof to the pre-laminating heat seal guide roller 521 and connected at the other end thereof to the pre-laminating frame 550.

The pre-laminating heat seal guide roller 521 may be rotatably connected to the pre-laminating heat seal guide holder 523. Such a relative rotation therebetween may be a simple rotation and various modifications can be made, such as having a structure in which a separate rotational force is provided In some embodiments. By virtue of such a configuration, a stable pressed state of the delamination seal (DS) can be formed and a stable covering process can be performed.

In the meantime, the pre-laminating unit 500 of the semiconductor chip delamination device 10 of the present invention further includes a pre-laminating transfer part (540). The pre-laminating transfer part 540 transfers the pre-laminating pressing part (510) of the pre-laminating unit (500) in a horizontal direction on the drawing sheet so as to be movable relative to the stage unit (400).

In other words, the pre-laminating transfer part 540 includes a pre-laminating transfer lead screw 545, a pre-laminating transfer lead block 543, and a pre-laminating transfer lead actuator 547.

Figure 2:
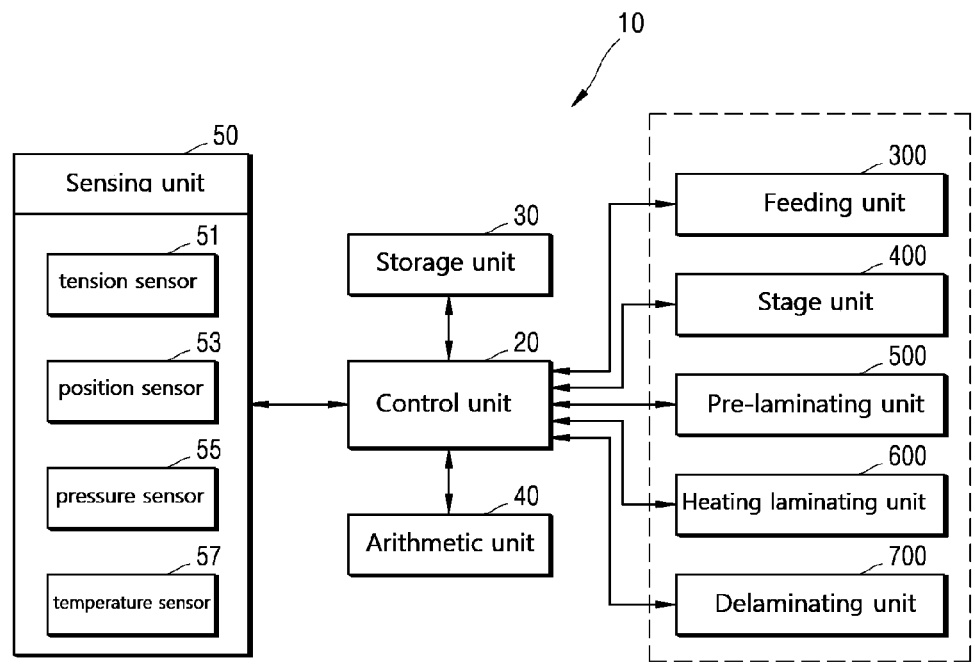
FIG. 2 is a schematic functional block diagram showing a semiconductor chip delamination device according to an embodiment of the present invention.
Figure 3:
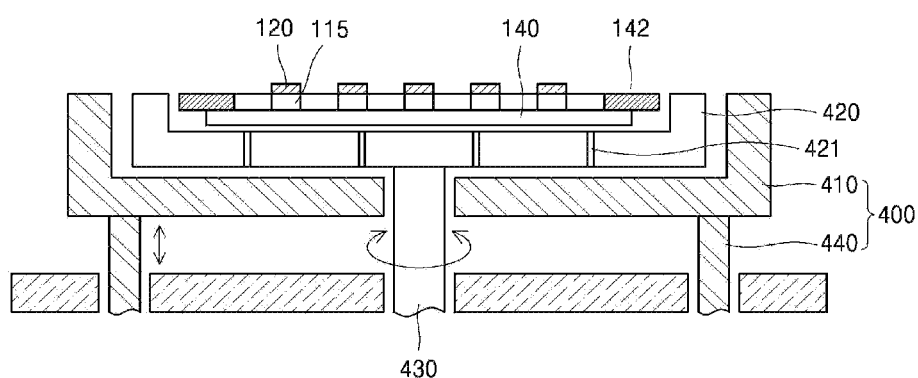
FIG. 3 is a schematic cross-sectional view showing a stage unit of a semiconductor chip delamination device according to an embodiment of the present invention.

The pre-laminating transfer lead screw 545 is disposed spaced apart from the stage unit 400 in such a manner as to be connected at one end thereof to the pre-laminating frame 550. The pre-laminating transfer lead block 543 moves along the longitudinal direction of the pre-laminating transfer lead screw 545. In addition, The pre-laminating transfer lead actuator 547 applies a rotational force to the pre-laminating transfer lead screw (545). The pre-laminating transfer lead screw 545 is rotated by being applied with the rotational force from the pre-laminating transfer lead actuator 547 to cause the pre-laminating transfer lead block 543 to be linearly moved. In other words, the pre-laminating transfer lead actuator 547 is operated in response to a control signal outputted from a control unit 20 which will be described later to control the pre-laminating transfer lead actuator so that position control can be performed. The sensing unit 50 further includes a separate position sensor 53 (see FIGS. 1 and 2) so that the operation of the pre-laminating transfer lead actuator 547 can be controlled more accurately.

Further, in the meantime, the pre-laminating unit 500 may further include a constituent element that provides certain heat In some embodiments. In other words, the pre-laminating unit 500 may further include a pre-laminating pressing heater 530. The pre-laminating pressing heater 530 is disposed at the pre-laminating pressing part (510). The pre-laminating pressing heater 530 may be disposed at a predetermined specific region along the circumference of the pre-laminating pressing roller 511 of the pre-laminating pressing part 510, but is preferably disposed uniformly along the circumference of the pre-laminating pressing roller 511.

By virtue of such a configuration, the pre-laminating pressing heater 530 may form a melting structure of the delamination seal (DS) using certain pressure and certain heat to form a predetermined pressing tack welding state.

Figure 7:
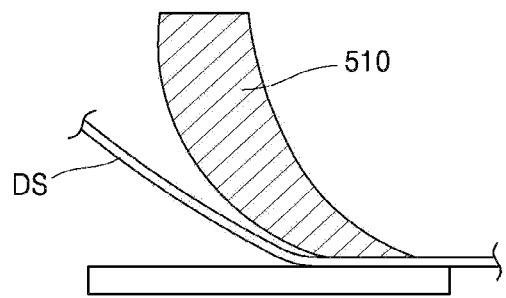
FIG. 7 is a schematic view showing a modification of a pre-laminating unit of a covering unit of a semiconductor chip delamination device according to an embodiment of the present invention.
Figure 8:
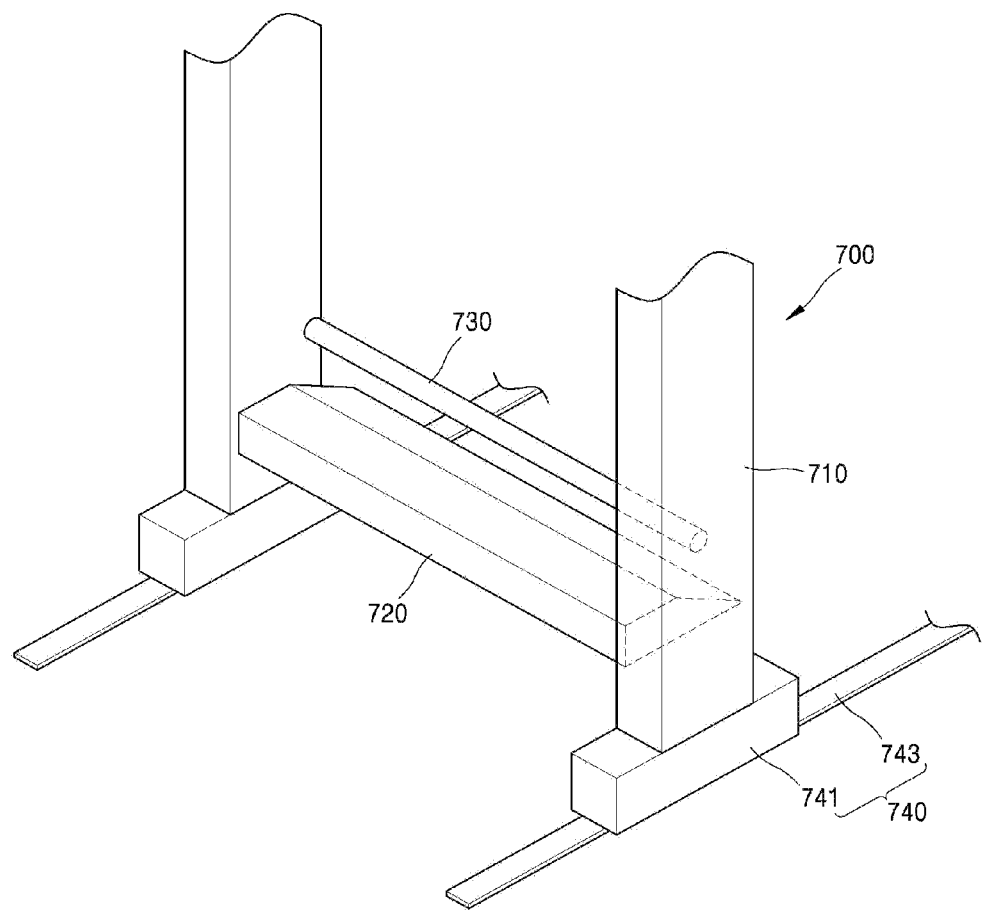
FIG. 8 is a schematic top perspective view showing a delaminating unit of a semiconductor chip delamination device according to an embodiment of the present invention.

Although it has been described in the above embodiment that the pre-laminating unit 500 of the present invention includes the pre-laminating pressing roller 511 having a rotating structure of a roller type, the present invention is not limited thereto, but various modifications can be made within the scope of forming a pressing structure. In other words, as shown in FIG. 7, the pre-laminating pressing part 510 of the pre-laminating unit 500 may be a blade type. In this case, as shown in FIG. 7, the blade type pre-laminating pressing part 510 is made of a flexible material having a predetermined rigidity, and thus it may be modified in various manners depending on design specifications, such as having a configuration in which a close adhesion property between the delamination seal (DS) and the protective tape 120 is strengthened by the predetermined rigidity while forming a predetermined deformation when moving.

In addition, meanwhile, the covering unit (500, 600) of the semiconductor chip delamination device 10 further may include a heating laminating unit 600 for increasing a close adhesion property between the delamination seal (DS) and the protective tape 120 attached to one surface of the semiconductor chip through heat besides formation of the pressing tack welding state. The heating laminating unit 600 thermally presses the delamination seal such that the delamination seal comes into bonding contact with the protective film 120 or the protective tape.

In this case, the heating laminating unit 600 includes a heating laminating body 610 and a heating laminating heater 620. The heating laminating body 610 is movable relative to the stage unit 400, and the heating laminating heater 620 is disposed at the heating laminating body 160 to transfer heat to the delamination seal. In some embodiments, the heating laminating heater 620 may have a configuration in which it transmits heat to the delamination seal in a state in which the heating laminating body 610 and the heat seal are spaced apart from each other, but the heating laminating body 610 has a structure in which it directly contacts and presses the delamination seal.

Figure 14:
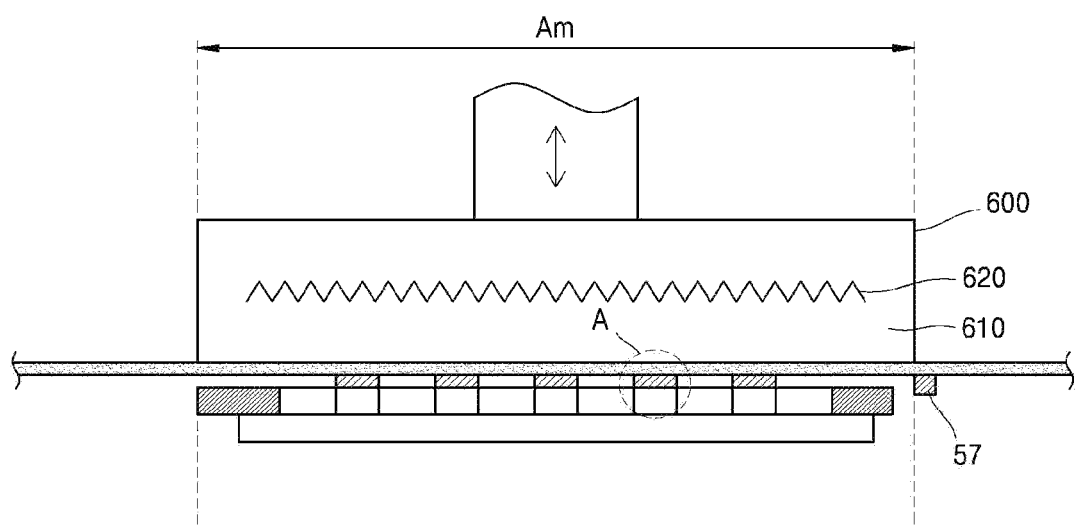

In other words, as shown in FIGS. 1 and 14, the heating laminating heater 620 disposed at the heating laminating body 610 provides heat and the bottom surface of the heating laminating body 610 comes into direct contact with the delamination seal (DS) to form a pressurized state due to its own weight to remove a very small amount of air bubbles between the delamination seal (DS) and the protective tape 120 attached to one surface of the semiconductor chip and to enable to form a melting region of the delamination seal (DS) by heating, so that the top surface of the protective tape 120 enables a connection state for a peeling off operation to be formed on the delamination seal (DS). In FIG. 14, a region on the delamination seal (DS), transmitted with heat from the heating laminating heater 620, is denoted by reference numeral Am, where a given melting phenomenon due to thermal deformation by heating can be found.

Figure 15:
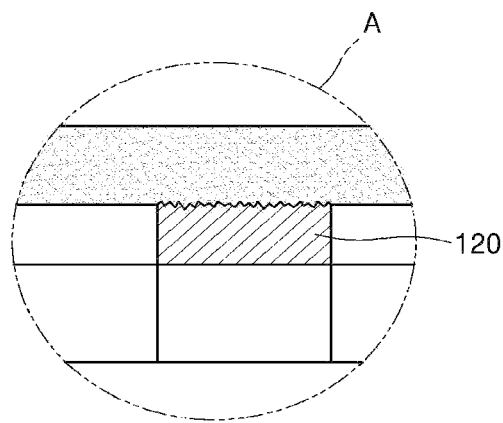

An enlarged view of a portion indicated by reference numeral A in FIG. 14 is shown in FIG. 15. The region Am on the delamination seal (DS), transmitted with heat through the heating laminating heater 620, forms a closely contacted state that is further reinforced between the delamination seal (DS) and the protective tape 120 due to the melting phenomenon, so that incomplete delamination can be prevented from occurring in a post peeling-off process.

Further, meanwhile, the covering unit (500, 600) of the semiconductor chip delamination device 10 further may include a heating laminating unit 600 for increasing a close adhesion property between the delamination seal (DS) and the protective tape 120 attached to one surface of the semiconductor chip through heat besides formation of the pressing tack welding state. The heating laminating unit 600 thermally presses the delamination seal such that the delamination seal comes into bonding contact with the protective film 120 or the protective tape.

In this case, the heating laminating unit 600 includes a heating laminating body 610 and a heating laminating heater 620. The heating laminating body 610 is movable relative to the stage unit 400, and the heating laminating heater 620 is disposed at the heating laminating body 160 to transfer heat to the delamination seal. In some embodiments, the heating laminating heater 620 may have a configuration in which it transmits heat to the delamination seal in a state in which the heating laminating body 610 and the heat seal are spaced apart from each other, but the heating laminating body 610 has a structure in which it directly contacts and presses the delamination seal.

In addition, meanwhile, the delaminating unit 700 according to an embodiment of the present invention serves to peel off, from the semiconductor chip, the delamination seal disposed to cover the semiconductor chip having the protective film disposed on one surface thereof.

The delaminating unit 700 includes a delaminating unit body 710, a delaminating unit peeler blade 720, and a delaminating unit peeler guide 730. The delaminating unit body 710 is disposed spaced apart from the stage unit 400, the delaminating unit peeler blade 720 is disposed at one end thereof at the delaminating unit body 710 such that a free end of the delaminating unit peeler blade 720 is positioned in a relative movement direction between the stage unit 400 and the delaminating unit body 710.

Figure 16:
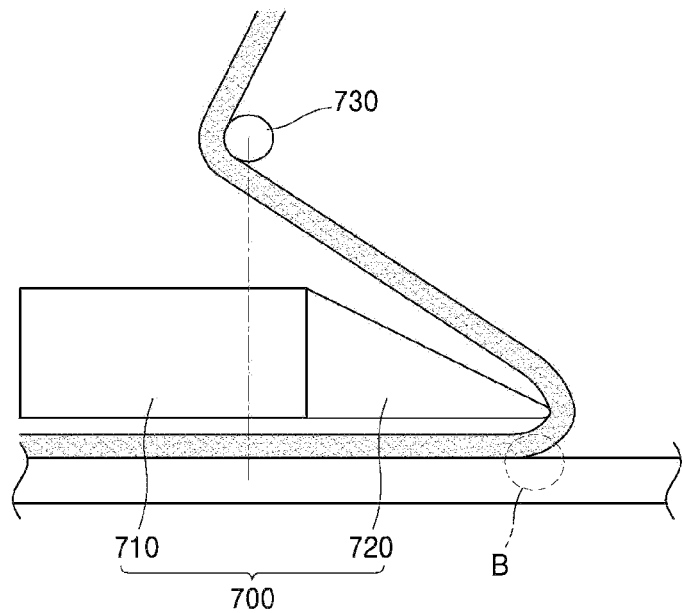
Figure 17:
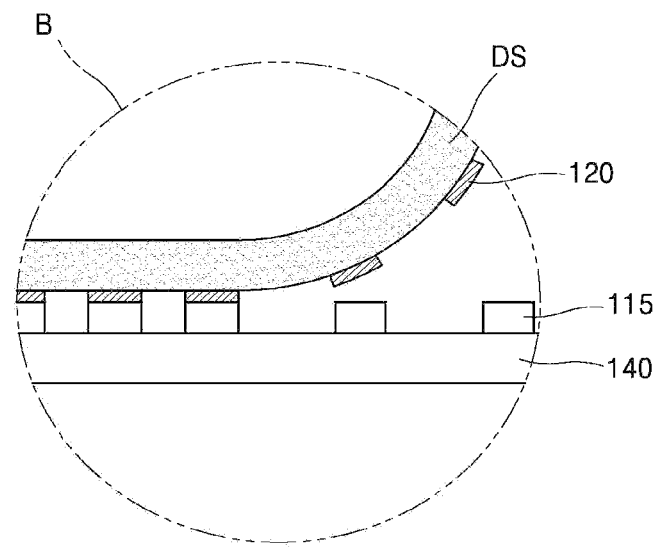
Figure 18:
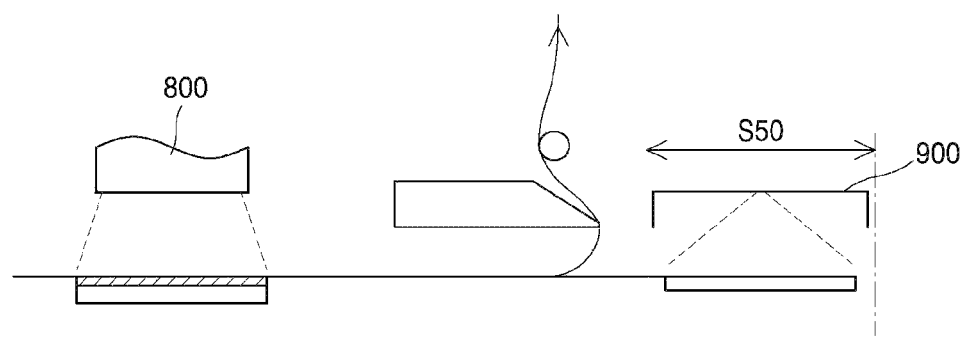
FIG. 18 is a schematic view showing a modification of a semiconductor chip delamination device according to an embodiment of the present invention.
Figure 19:
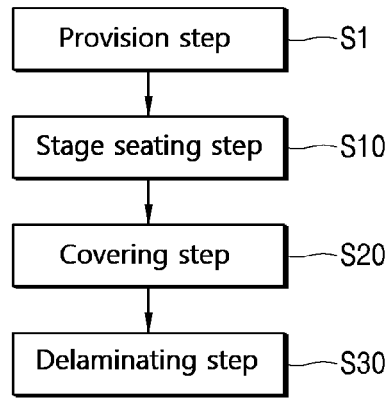
FIGS. 19 to 26 are flow charts showing a method of controlling of a semiconductor chip delamination device according to the present invention.
Figure 20:
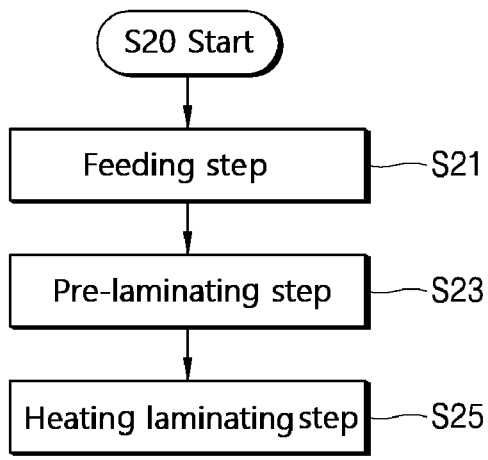
Figure 21:
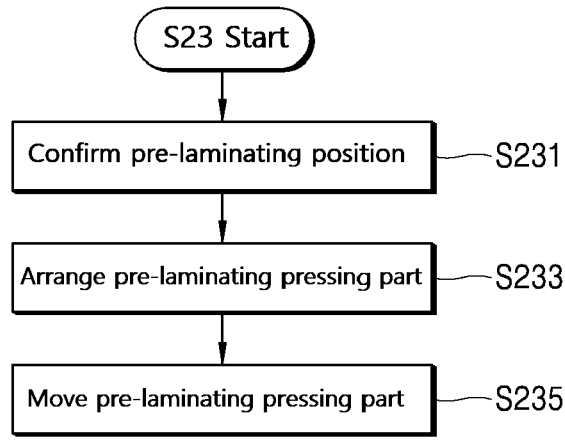
Figure 22:
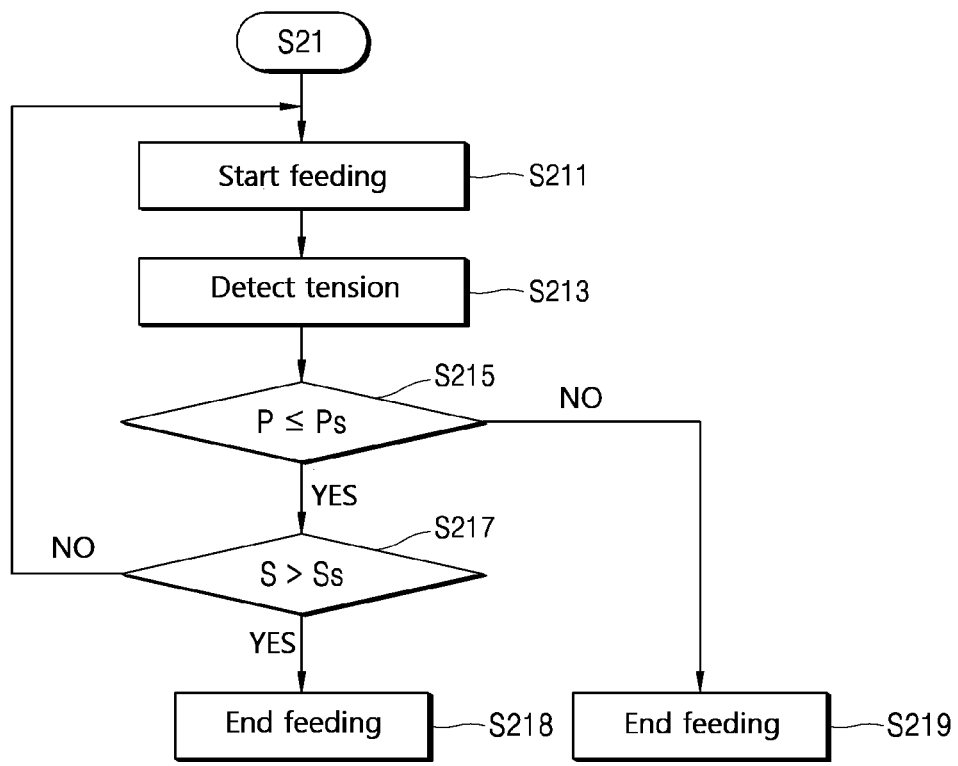
Figure 23:
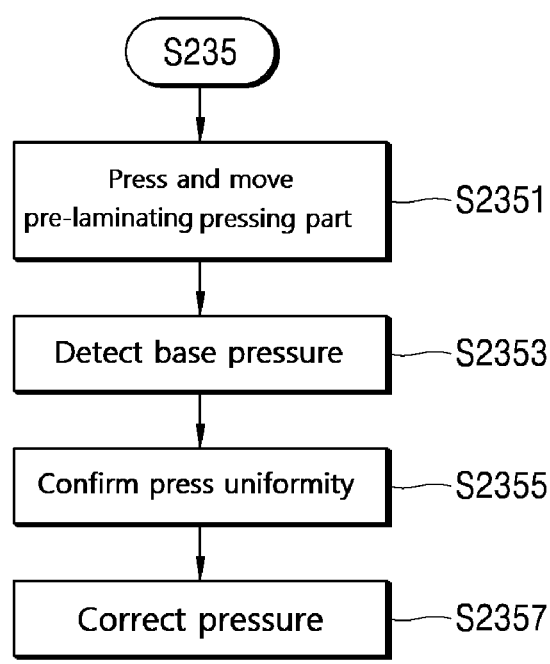
Figure 24:
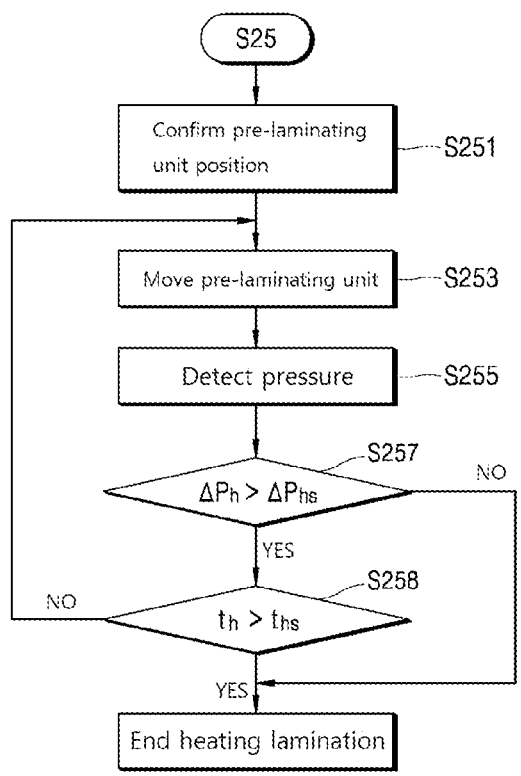
Figure 25:
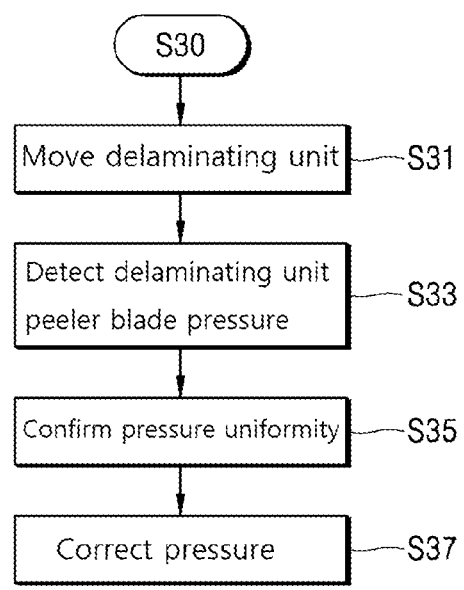
Figure 26:
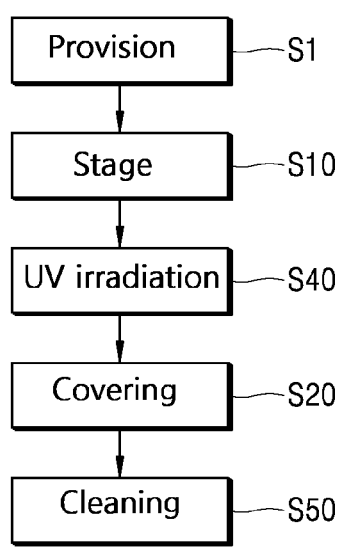

In other words, as shown in FIGS. 16 and 17, the delaminating unit peeler blade 720 has a structure in which one end thereof is formed in an edge shape of a predetermined angle as a free end, and the other end thereof is supportingly connected to the delaminating unit body 710. The delaminating unit peeler guide 730 is disposed at the delaminating unit body 710 so as to be located at a region opposite to the free end of the delaminating unit filler blade 720 when projected to a plane on which the stage unit 400 is disposed. By virtue of such a configuration, when the delamination seal (DS) is delaminated or peeled off via the delaminating unit peeler blade 720 having an edge shape, the delaminating unit peeler guide 730 guides the delamination seal (DS) to ensure a predetermined tension or guide a withdrawal direction so that a certain smooth delamination (i.e., peeling-off) operation can be implemented.

In some embodiments, the delaminating unit 700 may further include a delamination transfer part 740. If the stage unit 400 has a structure in which it moves horizontally along a line, a separate transfer part may be excluded, but in this embodiment, the delaminating unit 700 has a configuration in which it further includes a delamination transfer unit 740. The delamination transfer part 740 transfers the delaminating unit body 710, the delaminating unit peeler blade 720, and the delaminating unit peeler guide 730 so as to be movable relative to the stage unit 400.

The delamination transfer part (740) includes a delamination transfer guide (743), a delamination transfer block (741), and a delamination transfer actuator (745). The delamination transfer guide 743 is disposed spaced apart from the stage unit 400. The delamination transfer guide 743 may be disposed on a base (not shown) of the semiconductor chip delamination device 10 in such a manner as to be positioned parallel to the direction of the overall line.

The delamination transfer block 741 allows the delaminating unit body 710 to be connectedly disposed on one surface thereof and moves along the longitudinal direction of the delamination transfer guide 743. The delamination transfer guide 743 may have an LM guide configuration so that the delamination transfer block 741 can be operated in engagement therewith.

The delamination transfer actuator 745 applies a moving force to the delamination transfer block 741. The delamination transfer actuator 745 may be modified in various manners, such as being implemented as a lead screw type structure or a linear motor.

In this embodiment, the delaminating unit body 710 and the delaminating unit peeler blade 720 have a configuration in which they are merely fixedly connected to each other relative to each other, but may have a configuration in which they are movable relative to each other.

Figure 9:
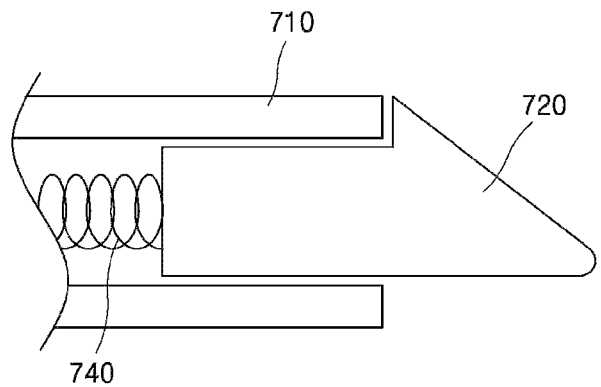
FIGS. 9 and 10 are schematic views showing modifications of a delaminating unit peeler guide of a delaminating unit of a semiconductor chip delamination device according to an embodiment of the present invention.

As shown in FIG. 9, the delaminating unit body 710 has a space defined therein to allow one end of the delaminating unit peeler blade 720 to be movably inserted thereinto, and further includes a delaminating unit peeler blade moving part 750 in the internal space of the delaminating unit body 710. The delaminating unit peeler blade moving part 750 is implemented as an elastic member so that if an excessive pressure is applied to the elastic member in a state in which a predetermined elastic force is established, a predetermined change in position occurs so that excessive tension can be prevented from being applied to the delamination seal (DS).

Figure 10:
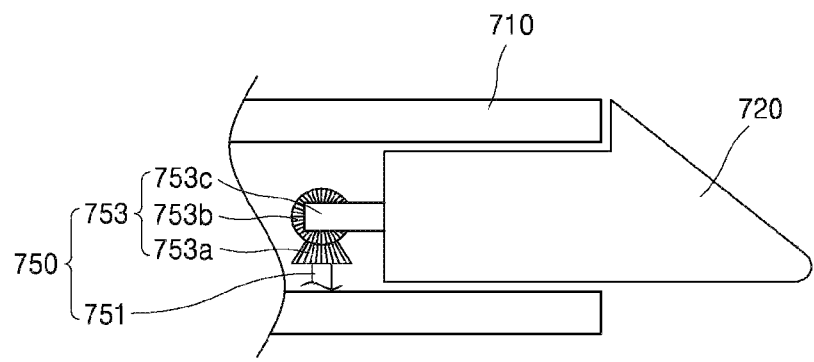

In addition, as shown FIG. 10, the delaminating unit body 710 has a space defined therein to allow one end of the delaminating unit peeler blade 720 to be movably inserted thereinto, and further includes a delaminating unit peeler blade moving part 750 in the internal space of the delaminating unit body 710. The delaminating unit peeler blade moving part 750 includes a moving drive part 751 and a moving transmission part 753. The moving drive part 751 is implemented as a power providing part connected to an actuator (not shown) and the moving transmission part 753 is implemented as a power transmission part so that various modifications thereof can be made, such as forming a smoother winding structure by allowing a change in position to occur when the tension applied to the delamination seal (DS) is excessively tightened or loosened. In this embodiment, the moving drive part 751 is an actuator illustrated as a shaft, which is implemented as an electric motor, and the moving transmission part 753 is implemented as a worm gear, a worm wheel gear, and a rack gear meshed therewith, but the configuration of the moving drive part and the moving transmission part may be modified in various manners depending on design specifications.

Meanwhile, in some embodiments, the semiconductor chip delamination device 10 may further include various constituent elements. In other words, the semiconductor chip delamination device 10 may further include a UV irradiator (800). The UV irradiator 800 irradiates an ultraviolet ray to the delamination seal that contactingly covers the protective film, i.e., the protective tape by the covering unit (500,600) to form a cured state of the delamination seal so that the delamination seal that contactingly covers the protective film, i.e., the protective tape can be prevented from being removed from the protective film.

Further, in some embodiments, the semiconductor chip delamination device 10 may further include a cleaning unit 900 configured to rapidly clean one surface of the semiconductor chip from which the delamination seal has been peeled off so that the defect of the chip can be minimized. The cleaning unit 900 is not limited to particular matters within the scope of cleaning one surface of the semiconductor chip.

The semiconductor chip delamination device 10 of the present invention may have an entire control system configuration that controls the implementation of the operation of each of the above-mentioned constituent elements. In other words, the semiconductor chip delamination device 10 of the present invention may further include a sensing unit 50, a control unit 20, a storage unit 30, and an arithmetic unit 40. The sensing unit 50 detects the operation state of at least one of the stage unit 400, the delamination feeding unit 300, the covering unit (500, 600), and the delaminating unit 700, which have been described above, and the state of the delamination seal. The control unit 20 applies a control signal to the stage unit 400, the delamination feeding unit 300, the covering unit (500, 600), and the delaminating unit 700 based on a sensing signal from the sensing unit 50 and preset data stored in the storage unit 30.

Figure 5:
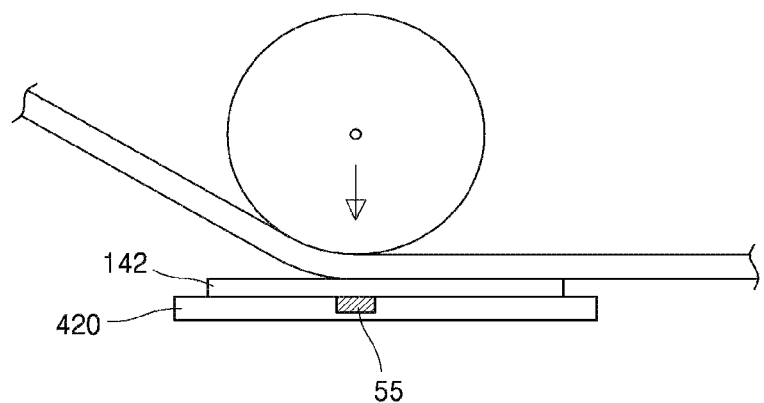
FIG. 5 is a schematic state view showing a partial configuration of a pre-laminating unit of a covering unit of a semiconductor chip delamination device according to an embodiment of the present invention.
Figure 6:
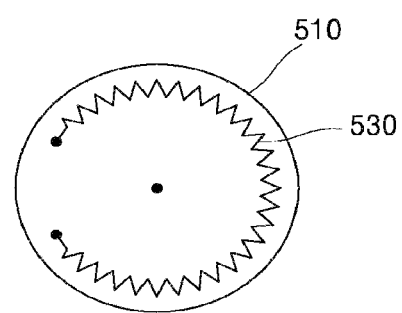
FIG. 6 is a schematic view showing a modification of a pre-laminating unit of a covering unit of a semiconductor chip delamination device according to an embodiment of the present invention.

In other words, the sensing unit 50 includes a tension sensor 51 (see FIG. 1), a position sensor 53, (see FIG. 1), a pressure sensor 55, (see FIGS. 1 and 5), and a temperature sensor 57 (see FIGS. 1 and 14).

The tension sensor 51 detects a tension applied to the delamination seal (DS). The tension sensor 51 may be disposed on the delamination feeding unit 300, the position sensor 53 may be disposed at a region for performing a work on the stage unit 400, the pressure sensor 55 is disposed on the stage plate 420 of the stage unit 400 to detect the pressure of the pre-laminating unit 500, and the temperature sensor 57 detects the temperatures of the ring frame disposed on the stage plate 420 and/or the protective tape disposed on the semiconductor chip disposed at the ring frame.

The arithmetic unit 40 performs a predetermined arithmetic process in response to an arithmetic control signal from the control unit 20, and the storage unit 30 loads certain preset data in response to a storage control signal from the control unit 20 and stores predetermined data therein, if necessary. The preset data stored in the storage unit 30 may include determination reference data such as a preset tension ts for determining whether or not the tension of the delamination seal is excessive, a preset pressure $P_{hs}$ for determining whether or not a pressing force or pressure applied to the stage plate by the pre-laminating unit 500 is appropriate, a preset position ss for determining whether or not the pre-laminating unit 500, the heating laminating unit 600, and the delaminating unit 700 are at an appropriate position, and a preset time ts for determining whether or not the heating operation time of the heating laminating unit 600 is appropriate.

Hereinafter, a method of controlling the semiconductor chip delamination device will be described with reference to the accompanying drawings.

The method of controlling the semiconductor chip delamination device of the present invention includes is a method of controlling a semiconductor chip delamination device for peeling off a protective film attached to one surface of a semiconductor chip, which includes a provision step S1, a stage seating step S1, a covering step S2, and a delaminating step S30.

In the provision strep S1, a semiconductor chip delamination device 10 is provided which includes: a sensing unit 50 configured to detect the operation state of the stage unit 400, the delamination feeding unit 300, the covering unit (500, 600), and the delaminating unit 700, and the state of the delamination seal; and a control unit 20 configured to apply a control signal to the stage unit 400, the delamination feeding unit 300, the covering unit (500, 600), and the delaminating unit 700 based on a sensing signal from the sensing unit 50 and preset data stored in a storage unit. In this case, a detailed description thereof will be omitted to avoid redundancy and will be replaced with the above description.

Thereafter, the control unit 20 executes the stage seating step S10. In the stage seating step S10, the ring frame, in which the semiconductor chip having the protective film attached thereto is disposed, is seated on the stage unit 400. In the stage seating step S10, stage unit 400 is moved in response to a stage control signal from the control unit 20 to move the ring frame to a predetermined position. In this case, a predetermined rotation and movement operation is performed in the same manner as in the above-described case.

In the covering step S20, the delamination seal to cover the semiconductor chip such that the delamination seal comes into close contact with the protective film. The covering step S20 includes a feeding step S21, a pre-laminating step S23, and a heating laminating step S25.

In feeding step S21, the control unit 20 controls the delamination seal to be fed to a corresponding position of the ring frame. The feeding step S21 includes a feeding start step S211, a tension detection and position confirmation step S213, a tension comparison step S215, and a position comparison step S217.

In the feeding start step S211, the control unit 20 controls the delamination feeding unit 300 to feed the delamination seal contactable with the protective film to peel off the protective film from the semiconductor chip.

Thereafter, the control unit 20 executes the tension detection and position confirmation step S213 where the tension sensor 51 of the sensing unit 50 detects a tension applied to the delamination seal, and checks the moving position of the delamination seal. The arithmetic unit 40 may performs an arithmetic process on the moving position of the delamination seal in response to an arithmetic control signal from the control unit 20 based on the winding operation of the feeding unit trailing winder 310 and the feeding unit leading winder 320.

After the execution of the tension detection and position confirmation step S213, the control unit 20 executes the tension comparison step S215 where the control unit 20 compares the tension P applied to the delamination seal with a preset tension PS of the preset data stored in the storage unit 30. If it is determined in the tension comparison step S215 that the tension P is less than or equal to the preset tension PS, the control flow proceeds to step S217, and if the tension P exceeds the preset tension PS, the control flow proceeds to step S219. In other words, if it is determined in the tension comparison step S215 that the tension detected by the control unit 20 is more than the present tension, the control unit 20 determines that the tension of the delamination seal is abnormal to allow the control flow to proceed to an emergency response step S219 where the control unit 20 may control the winding operation of the feeding unit trailing winder 310 and the feeding unit leading winder 320 of the delamination feeding unit 300 as an emergency operation of lowering the tension.

If it is determined in the tension comparison step S215 that the tension P is less than or equal to the preset tension PS, the control flow proceeds to the position comparison step S217 where the control unit 20 compares the moving position of the delamination seal with a preset position SS of the preset data stored in the storage unit 30 to confirm whether or not the required position of the delamination seal is secured.

Subsequently, the control unit 20 executes the pre-laminating step S23 where the control unit 20 controls the delamination seal to come into pressingly contact with the protective film attached to the top surface of the semiconductor chip disposed at the ring frame through the pre-laminating unit 500 of the covering unit (500, 600).

The pre-laminating step S23 includes a pre-laminating pressing part arrangement step S233 and a pre-laminating pressing part movement step S235, and may further include a pre-laminating position confirmation step S231.

In the pre-laminating pressing part arrangement step S233, the control unit 20 outputs a transfer control signal to control the pre-laminating unit 500 to be arranged on the semiconductor chip disposed at the ring frame seated on the stage unit 400. In pre-laminating pressing part movement step S235, the control unit 20 applies a movement control signal to the pre-laminating pressing actuator 560 to control the delamination seal to come into pressingly contact with the protective film attached to the top surface of the semiconductor chip disposed at the ring frame by moving the pre-laminating pressing part 510 of the pre-laminating unit 500.

At this time, before the execution of step S233, the control unit 20 executes a pre-laminating position confirmation step S231 of allowing the position sensor 53 of the sensing unit 50 to check the position of the pre-laminating unit 500 in response to a sensing control signal from the control unit 20 so that the position of the pre-laminating unit 500 can be recognized more accurately.

More specifically, the pre-laminating pressing part movement step S235 includes a pre-laminating pressing part pressing movement step S2351, a base pressure detection step S2353, a pressure uniformity confirmation step S2355, and a pressure correction correction step S2357.

In the pre-laminating pressing part pressing movement step S2351, the control unit 20 outputs a movement control signal to control the pre-laminating pressing part 510 of the pre-laminating unit 500 to be vertically moved to allow the pre-laminating pressing part 510 of the pre-laminating unit 500 to come into direct contact with the delamination seal.

After the execution of the pre-laminating pressing part pressing movement step S2351, the control unit 20 executes the base pressure detection step S2353 where the control unit 20 applies a sensing control signal to the sensing unit 50 to control a plurality of pressure sensors 55 of the sensing unit 50 to detect a pressure applied to the protective film attached to the top surface of the semiconductor chip disposed at the ring frame through the delamination seal by the pre-laminating pressing part 510 of pre-laminating unit 500.

After the execution of the base pressure detection step S2353, the control unit 20 executes the pressure uniformity confirmation step S2355 where the control unit 20 checks the uniformity of the detected input values of the pressure sensors 55, and executes the pressure correction correction step S2357 where a corrected pressure is applied to a pressing side of an input value that is not uniform in the pressure uniformity confirmation step S2355, so that a pressure difference checked in pressure uniformity confirmation step S2355 is corrected to correct a pressure applied to the pre-laminating pressing actuator 560, and ultimately correct a difference in the pressure applied so as to be biased toward the delamination seal.

In the meantime, in the heating laminating step S25, the control unit 20 controls the delamination seal to come into thermally melting contact with the protective film attached to the top surface of the semiconductor chip disposed at the ring frame through the heating laminating unit 600 of the covering unit (500, 600). The heating laminating step S25 includes a heating laminating unit position confirmation step S251, a heating laminating movement step S253, a pressure and temperature detection step S255, a pressure comparison step S257, and a temperature comparison step S258.

First, in the heating laminating unit position confirmation step S251, the control unit 20 applies a sensing control signal to the sensing unit 50 to control the position sensor 53 of the sensing unit 50 to check the position of the heating laminating unit 600.

After the execution of the heating laminating unit position confirmation step S251, the control unit 20 executes the heating laminating movement step S253 where the control unit 20 applies a movement control signal to the heating laminating unit 600 to control the heating laminating unit 600 to move to allow the delamination seal to come into thermally melting contact with the protective film attached to the top surface of the semiconductor chip disposed at the ring frame through the heating laminating unit 600 to perform the control of a predetermined vertical descent pressing movement and a heater operation.

After the execution of the heating laminating movement step S253, the control unit 20 executes the pressure and temperature detection step S255 where the control unit 20 applies a sensing control signal to the sensing unit 50 to control the pressure sensor 55 of the sensing unit 50 to detect a pressure applied to the protective film attached to the top surface of the semiconductor chip disposed at the ring frame through the delamination seal, and control the temperature sensor 57 of the sensing unit 50 to detect the temperature of the protective film.

After the execution of the pressure and temperature detection step S255, the control unit 20 executes the pressure comparison step S257 where the control unit 20 compares a detected pressure value $P_h$ of the pressure sensor 55 with a preset pressure value $P_{hs}$ of the preset data stored in the storage unit 30. If it is determined in step S257 that the detected pressure value $P_h$ is more than the preset pressure value $P_{hs}$, the control unit 20 determines that a certain melting has not been achieved, and the control flow proceeds to step S258. On the contrary, if it is determined that the detected pressure value $P_h$ is less than or equal to the preset pressure value $P_{hs}$, the control unit 20 determines that the certain melting has been achieved, and ends the heating lamination operation of step S25.

Thereafter, if it is determined in step S257 that the detected pressure value $P_h$ is more than the preset pressure value $P_{hs}$, the control flow proceeds to the temperature comparison step S258 where the control unit 20 compares a detected temperature value $t_h$ of the temperature sensor 57 with a preset pressure value $t_{hs}$ of the preset data stored in the storage unit 30.

If it is determined in step S258 that the detected temperature value $t_h$ of the temperature sensor 57 is less than or equal to the preset pressure value $t_{hs}$ of the preset data stored in the storage unit 30, the control flow returns to step S233 where the control unit 20 executes a predetermined heating process. On the contrary, if it is determined in step S258 that the detected temperature value $t_h$ of the temperature sensor 57 is more than the preset pressure value $t_{hs}$ of the preset data stored in the storage unit 30, the control unit 20 ends the heating lamination operation of step S25.

In the meantime, in the delaminating step S30, the control unit 20 controls the delaminating unit 700 to peel off, from the semiconductor chip, the delamination seal disposed to cover the semiconductor chip having the protective film disposed on one surface thereof.

The delaminating step S30 includes a delaminating unit movement step S31, a delaminating unit peeler blade pressure detection step S33, a pressure uniformity confirmation step S35, and a pressure correction step S37.

In the delaminating unit movement step S31, the control unit 22 controls the delaminating unit to be moved to peel off, from the semiconductor chip, the delamination seal disposed to cover the semiconductor chip having the protective film disposed on one surface thereof.

In the delaminating unit peeler blade pressure detection step S33, the control unit 20 control the pressure sensor 55 to detect a pressure applied to the delaminating unit peeler blade 720. In the pressure uniformity confirmation step S35, the control unit 20 compares the pressure detected in the delaminating unit peeler blade pressure detection step S33 with the preset pressure value of the preset data stored in the storage unit (30). In the pressure correction step S37, the control unit 20 regulates a pressure applied to the delaminating unit peeler blade.

Meanwhile, the semiconductor chip delamination device (10) further includes a UV irradiator 800. The method further includes, after the covering step S20, a UV irradiating step S40 that is executed between the covering step S20 and the delaminating step S30, and irradiates an ultraviolet ray onto the delamination seal disposed to cover the semiconductor chip having the protective film disposed on one surface thereof.

The semiconductor chip delamination device 10 further includes a cleaning unit (900), and the method further includes, after the delaminating step S30, a cleaning step S50 of cleaning one surface of the semiconductor chip from which the delamination seal for allowing the protective film in a melting contact state to be separated from the semiconductor chip is peeled off.

Although the semiconductor chip delamination device and control method thereof for carrying out the present invention has been described above, various modifications thereof can be made within the scope of including essential constituent elements of the present invention. In other words, in an embodiment of the present invention, although a description has been made centering on a configuration in which the covering unit includes the pre-laminating unit and the heating laminating unit that transfers heat in a direct contact method or a spaced-apart radiation method, especially transfers heat in the direct contact method, the covering unit of the present invention is not limited thereto but it is possible to implement a high frequency-based heat transfer method besides a heat transfer method by radiation or conduction, or direct contact.

Figure 27:
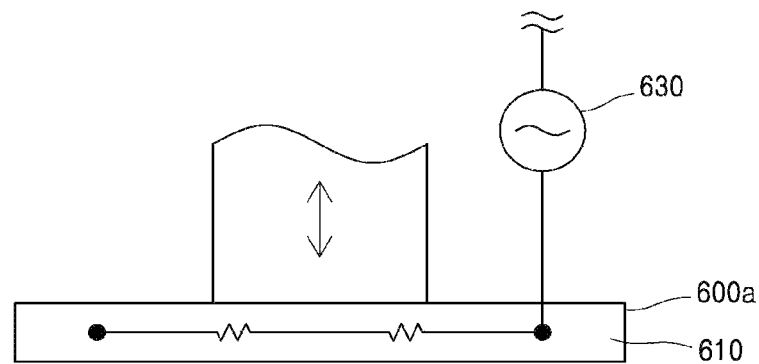
FIGS. 27 and 28 are schematic views showing modifications of a heating laminating unit of a semiconductor chip delamination device according to an embodiment of the present invention.
Figure 27:
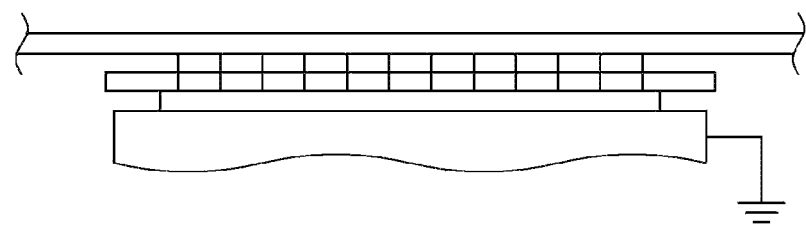
Figure 28:
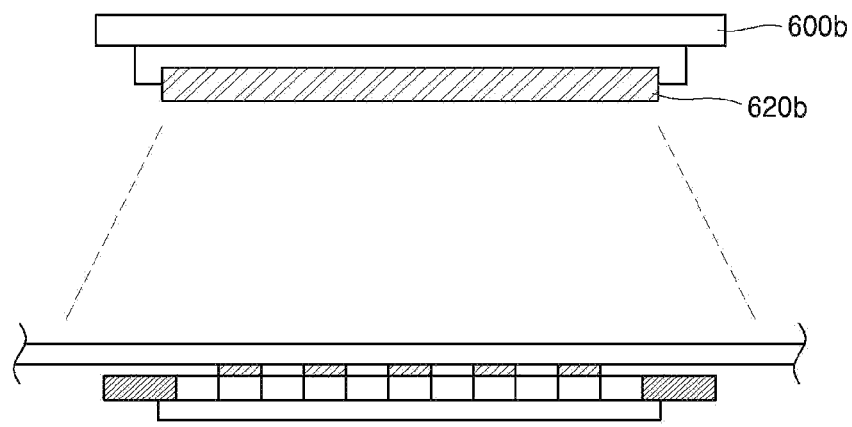

In other words, the covering unit (500, 600a; 600b) may further include a heating laminating unit 600a employing a high frequency thermal boding method. The heating laminating unit may be implemented as a heating laminating unit 600a employing the high frequency thermal boding method, one example of which is shown in FIG. 27. The heating laminating unit 600a includes a heating laminating body 610 and a heating laminating power supply 630 that is electrically connected to a high frequency generator disposed at the heating laminating body. In addition, an element corresponding to the heating laminating unit 600a, for example the stage unit 400 forms a grounding structure so that a high frequency generated from the high frequency generator by electric power supplied from the heating laminating power supply 630 enables high frequency thermal bonding between the delamination seal (DS) and the protective film 120 formed on one surface of each of the semiconductor chips 115 disposed at the ring frame 142 on which the adhesive tape 140 is disposed in the stage unit 400 in a grounded state. In this case, the contactability or proximity between the heating laminating body and the delamination seal may be formed in various manners depending on design specifications.

Further, the heating laminating unit of the present invention is not limited to the above configuration, but may further include a high photothermal infrared heating laminating heater 620b having a photothermal bonding structure employing a heat transfer method based on thermal radiation by infrared rays, and the control method of semiconductor chip delamination device of the present invention may be modified in various manners, such as additionally including a pressurization step using a pressurization device after performing a thermal bonding process using high frequency or hot air, or strengthening formation of thermal bonding between the delamination seal and the protective film using the UV irradiation as described above.

As such, in the case where the high frequency thermal bonding technique or the high photothermal infrared thermal bonding technique is employed, the detailed configuration of the above-mentioned heating laminating step S25 may be modified in various manners depending in design specifications, such as being the same, or being slightly changed. In other words, in the heating laminating step S25, the delamination seal comes into thermally melting contact with the protective film attached to the top surface of the semiconductor chip disposed at the ring frame through the heating laminating unit (600a; 600b) of the covering unit (500, 600a; 500, 600b). The heating laminating step S25 includes a heating laminating unit position confirmation step S251, a heating laminating movement step S253, a pressure and temperature detection step S255, a pressure comparison step S257, and a temperature comparison step S258, which is the same as in the above description.

First, in the heating laminating unit position confirmation step S251, the control unit 20 applies a sensing control signal to the sensing unit 50 to control the position sensor 53 of the sensing unit 50 to check the position of the heating laminating unit 600. After the execution of the heating laminating unit position confirmation step S251, the control unit 20 executes the heating laminating movement step S253 where the control unit 20 applies a movement control signal to the heating laminating unit 600 to control the heating laminating unit 600 to move to allow the delamination seal to come into thermally melting contact with the protective film attached to the top surface of the semiconductor chip disposed at the ring frame through the heating laminating unit (600a, 600b) to perform the control of a predetermined vertical descent pressing movement and a heater operation. Various modifications may be made depending on design specifications, such as equally applying a configuration in which the delamination seal comes into thermally melting contact with the protective film attached to the top surface of the semiconductor chip disposed at the ring frame through the heating laminating unit (600a, 600b).

INDUSTRIAL APPLICABILITY

Although the semiconductor chip delamination device according to the present invention has been described focusing on an example of delamination, it can be applied in various industrial fields within the scope of performing a delamination function through the delaminating unit.

The invention claimed is:

1. A semiconductor chip delamination device for peeling off a protective film attached to one surface of a semiconductor chip, comprising:
    a stage unit (400) configured to allow a ring frame, in which the semiconductor chip having the protective film attached thereto is disposed, to be seated thereon;
    a delamination feeding unit (300) configured to feed a delamination seal contactable with the protective film so as to peel off the protective film from the semiconductor chip;
    a covering unit (500, 600) configured to allow the delamination seal to cover the semiconductor chip such that the delamination seal comes into close contact with the protective film; and
    a delaminating unit (700) configured to peel off, from the semiconductor chip, the delamination seal disposed to cover the semiconductor chip having the protective film disposed on one surface thereof;
    wherein the stage unit (400) includes:
    a stage plate (420) configured to allow the ring frame to be seated thereon;
    a stage base (410) configured to allow the stage plate (420) to be seated thereon; a stage base shaft (430) configured to rotate the stage plate (420); and
    a stage base lifter (440) seatingly connected at one end to the stage base (420) to lift stage plate (420).

2. The semiconductor chip delamination device according to claim 1, wherein the covering unit (500, 600) includes a pre-laminating unit (500) configured to press the delamination seal while moving relative to the delamination seal that the delamination seal comes into close contact with the protective film.

3. The semiconductor chip delamination device according to claim 2, wherein the pre-laminating unit (500) is a roller type.

4. The semiconductor chip delamination device according to claim 3, wherein the pre-laminating unit (500) includes:
    a pre-laminating frame (550) disposed spaced apart from the stage unit (400); and
    a pre-laminating pressing part (510) disposed at the pre-laminating frame (550) in such a manner as to be movable relative to the pre-laminating frame (550), and the pre-laminating pressing part (510) includes a rotating structure.

5. The semiconductor chip delamination device according to claim 4, wherein the pre-laminating pressing part (510) includes:
    a pre-laminating pressing roller (511) configured to be able to come into direct contact with a heat seal;
    a pre-laminating pressing frame (513) disposed so as to be movable relative to the pre-laminating frame (550) such that the pre-laminating pressing roller (511) is rotatable relative to the pre-laminating pressing frame (513); and
    a pre-laminating pressing actuator (560) disposed at one side thereof on the pre-laminating frame (550) and connected at another side thereof to the pre-laminating pressing frame (513) to provide a driving force to drive the pre-laminating pressing roller (511).

6. The semiconductor chip delamination device according to claim 4, wherein the pre-laminating unit (500) includes a pre-laminating heat seal guide (520) fixedly disposed at the pre-laminating frame (550) in such a manner as to be spaced apart from the pre-laminating pressing part (510) and configured to guide the heat seal therealong.

7. The semiconductor chip delamination device according to claim 6, wherein the pre-laminating heat seal guide (520) includes:
    a pre-laminating heat seal guide roller (521) configured to be able to come into direct contact with the heat seal to guide the heat seal therealong; and
    a pre-laminating heat seal guide holder (523) connected at one end thereof to the pre-laminating heat seal guide roller (521) and connected at another end thereof to the pre-laminating frame (550).

8. The semiconductor chip delamination device according to claim 4, wherein the pre-laminating unit (500) further includes a pre-laminating transfer part (540) configured to transfer the pre-laminating pressing part (510) of the pre-laminating unit (500) in a horizontal direction so as to be movable relative to the stage unit (400).

9. The semiconductor chip delamination device according to claim 8, wherein the pre-laminating transfer part (540) includes:
    a pre-laminating transfer lead screw (545) disposed spaced apart from the stage unit (400) in such a manner as to be connected at one end thereof to the pre-laminating frame (550);
    a pre-laminating transfer lead block (543) configured to move along the longitudinal direction of the pre-laminating transfer lead screw (545); and a pre-laminating transfer lead actuator (547) configured to apply a rotational force to the pre-laminating transfer lead screw (545).

10. The semiconductor chip delamination device according to claim 4, wherein the pre-laminating unit (500) further includes a pre-laminating pressing heater (530) disposed at the pre-laminating pressing part (510).

11. The semiconductor chip delamination device according to claim 2, wherein the pre-laminating unit (500) is a blade type.

12. The semiconductor chip delamination device according to claim 2, wherein the covering unit (500, 600) includes a heating laminating unit (600) configured to thermally press the delamination seal such that the delamination seal comes into bonding contact with the protective film.

13. The semiconductor chip delamination device according to claim 12, wherein the heating laminating unit (600) includes:
   a heating laminating body (610) configured to be movable relative to the stage unit (400); and
   a heating laminating heater (620) disposed at the heating laminating body (610) to transmit heat to the heat seal.

14. The semiconductor chip delamination device according to claim 13, wherein the heating laminating body (610) directly contacts and presses the heat seal.

15. The semiconductor chip delamination device according to claim 1, wherein the delaminating unit (700) includes:
   a delaminating unit body (710) disposed spaced apart from the stage unit (400);
   a delaminating unit peeler blade (720) disposed at one end thereof at the delaminating unit body (710) such that a free end of the delaminating unit peeler blade (720) is positioned in a relative movement direction between the stage unit (400) and the delaminating unit body (710); and
   a delaminating unit peeler guide roller (730) disposed at the delaminating unit body (710) so as to be located at a region opposite to the free end of the delaminating unit peeler blade (720) when projected to a plane on which the stage unit (400) is disposed.

16. The semiconductor chip delamination device according to claim 15, wherein the delaminating unit (700) includes: a delamination transfer part (740) configured to transfer the delaminating unit so as to be movable relative to the stage unit (400).

17. The semiconductor chip delamination device according to claim 16, wherein the delamination transfer part (740) includes:
   a delamination transfer guide rail (743) disposed spaced apart from the stage unit (400);
   a delamination transfer block carriage (741) configured to allow the delaminating unit body (710) to be connectedly disposed on one surface thereof and move along the longitudinal direction of the delamination transfer guide rail (743); and
   a delamination transfer lead screw or linear motor (745) configured to apply a moving force to the delamination transfer block carriage (741).

18. The semiconductor chip delamination device according to claim 1, wherein the delamination feeding unit (300) includes:
   a feeding unit trailing rotating reel winder (310) configured to allow one end of the delamination seal to be connected thereto; and
   a feeding unit leading rotating reel winder (320) configured to allow another end of the delamination seal to be connected thereto and operate in cooperation with the feeding unit trailing winder (310) to allow the delamination seal to be wound thereon.

19. The semiconductor chip delamination device according to claim 1, wherein the semiconductor chip delamination device further includes a UV irradiator (800) configured to irradiate an ultraviolet ray to the delamination seal that contactingly covers the protective film by the covering unit (500,600).

20. The semiconductor chip delamination device according to claim 1, wherein the semiconductor chip delamination device includes:
   a sensing unit (50) including at least one of a tension sensor (51), a position sensor (53), a pressure sensor (55) or a temperature sensor (57), the sensing unit (50) being configured to detect an operation state of at least one of the stage unit (400), the delamination feeding unit (300), the covering unit (500, 600), and the delaminating unit (700), and the state of the delamination seal; and
   a control unit (20) configured to apply a control signal to the stage unit (400), the delamination feeding unit (300), the covering unit (500, 600), and the delaminating unit (700) based on a sensing signal from the sensing unit (50) and preset data stored in a storage unit.

21. The semiconductor chip delamination device according to claim 2, wherein the covering unit includes a high-frequency thermal bonding emitter (600*a*) configured to thermally bond the delamination seal to the protective film using high frequency such that the delamination seal comes into bonding contact with the protective film.

22. The semiconductor chip delamination device according to claim 2, wherein the covering unit includes an infrared heater (600*b*) configured to thermally bond the delamination seal to the protective film using a high heat infrared ray such that the delamination seal comes into bonding contact with the protective film.

23. A method of controlling a semiconductor chip delamination device for peeling off a protective film attached to one surface of a semiconductor chip, the method including:
   a provision step (S1) of providing a semiconductor chip delamination device (10), the semiconductor chip delamination device (10) including:
      a stage unit (400) configured to allow a ring frame, in which the semiconductor chip having the protective film attached thereto is disposed, to be seated thereon;
      a delamination feeding unit (300) configured to feed a delamination seal contactable with the protective film so as to peel off the protective film from the semiconductor chip;
      a covering unit (500, 600) configured to allow the delamination seal to cover the semiconductor chip such that the delamination seal comes into close contact with the protective film; and
      a delaminating unit (700) configured to peel off, from the semiconductor chip, the delamination seal disposed to cover the semiconductor chip having the protective film disposed on one surface thereof;
   wherein the stage unit (400) includes:
      a stage plate (420) configured to allow the ring frame to be seated thereon;
      a stage base (410) configured to allow the stage plate (420) to be seated thereon;
      a stage base shaft (430) configured to rotate the stage plate (420); and a stage base lifter (440) seatingly connected at one end to the stage base (420) to lift stage plate (420);

a sensing unit (50) configured to detect the operation state of the stage unit (400), the delamination feeding unit (300), the covering unit (500, 600), and the delaminating unit (700), and the state of the delamination seal; and a control unit (20) configured to apply a control signal to the stage unit (400), the delamination feeding unit (300), the covering unit (500, 600), and the delaminating unit (700) based on a sensing signal from the sensing unit (50) and preset data stored in a storage unit;

a stage seating step (S10) of allowing the ring frame, in which the semiconductor chip having the protective film attached thereto is disposed, to be seated on the stage unit (400);

a covering step (S20) of allowing the delamination seal to cover the semiconductor chip such that the delamination seal comes into close contact with the protective film; and a delaminating step (S30) of peeling off, from the semiconductor chip, the delamination seal disposed to cover the semiconductor chip having the protective film disposed on one surface thereof.

24. The control method of a semiconductor chip delamination device according to claim 23, wherein the covering step (S20) includes:

a feeding step (S21) of allowing the control unit (20) to control the delamination seal to be fed to a corresponding position of the ring frame;

a pre-laminating step (S23) of allowing the delamination seal to come into pressingly contact with the protective film attached to a top surface of the semiconductor chip disposed at the ring frame through the pre-laminating unit (500) of the covering unit (500, 600); and a heating laminating step (S25) of allowing the delamination seal to come into thermally melting contact with the protective film attached to the top surface of the semiconductor chip disposed at the ring frame through the heating laminating unit (600) of the covering unit (500, 600).

25. The control method of a semiconductor chip delamination device according to claim 24, wherein the feeding step (S21) includes:

a feeding start step (S211) of allowing the control unit (20) to control the delamination feeding unit (300) to feed the delamination seal contactable with the protective film to peel off the protective film from the semiconductor chip;

a tension detection and position confirmation step (S213) of allowing a tension sensor (51) of the sensing unit (50) to detect a tension applied to the delamination seal, and check a moving position of the delamination seal;

a tension comparison step (S215) of allowing the control unit (20) to compare a tension (P) applied to the delamination seal with a preset tension PS of the preset data stored in the storage unit (30); and a position comparison step (S217) of allowing the control unit (20) to compare the moving position of the delamination seal with a preset position (SS) of the preset data stored in the storage unit (30).

26. The control method of a semiconductor chip delamination device according to claim 24, wherein if it is determined in the tension comparison step (S215) by the control unit (20) that the tension detected is more than the preset tension, the control unit (20) determines that the tension of the delamination seal is abnormal to allow a control flow to proceed to an emergency response step (S219).

27. The control method of a semiconductor chip delamination device according to claim 24, wherein the pre-laminating step (S23) includes:

a pre-laminating pressing part arrangement step (S233) of allowing the pre-laminating unit (500) to be arranged on the semiconductor chip disposed at the ring frame seated on the stage unit (400); and a pre-laminating pressing part movement step (S235) of allowing the delamination seal to come into pressingly contact with the protective film attached to the top surface of the semiconductor chip disposed at the ring frame by moving a pre-laminating pressing part (510) of the pre-laminating unit (500).

28. The control method of a semiconductor chip delamination device according to claim 27, wherein the pre-laminating step (S23) includes a pre-laminating position confirmation step (S231) of allowing a position sensor (53) of the sensing unit (50) to check a position of the pre-laminating unit (500).

29. The control method of a semiconductor chip delamination device according to claim 27, wherein the pre-laminating pressing part movement step (S235) includes:

a pre-laminating pressing part pressing movement step (S2351) of allowing the pre-laminating pressing part (510) of the pre-laminating unit (500) to be vertically moved to cause the pre-laminating pressing part (510) of the pre-laminating unit (500) to come into direct contact with the delamination seal;

a base pressure detection step (S2353) of allowing a plurality of pressure sensors (55) of the sensing unit (50) to detect a pressure applied to the protective film attached to the top surface of the semiconductor chip disposed at the ring frame through the delamination seal by the pre-laminating pressing part (510) of pre-laminating unit (500);

a pressure uniformity confirmation step (S2355) of checking a uniformity of detected input values of the pressure sensors (55); and a pressure correction step (S2357) of correcting a pressure difference checked in the pressure uniformity confirmation step (S2355).

30. The control method of a semiconductor chip delamination device according to claim 24, wherein the heating laminating step (S25) includes:

a heating laminating unit position confirmation step (S251) of allowing a position sensor (53) of the sensing unit (50) to check the position of the heating laminating unit (600);

a heating laminating movement step (S253) of moving the heating laminating unit (600) to allow the delamination seal to come into thermally melting contact with the protective film attached to the top surface of the semiconductor chip disposed at the ring frame through the heating laminating unit (600);

a pressure and temperature detection step (S255) of allowing a pressure sensor (55) of the sensing unit (50) to detect a pressure applied to the protective film attached to the top surface of the semiconductor chip disposed at the ring frame through the delamination seal, and allowing a temperature sensor (57) of the sensing unit (50) to detect the temperature of the protective film;

a pressure comparison step (S257) of comparing a detected pressure value ($P_h$) of the pressure sensor (55)

with a preset pressure value ($P_{hs}$) of the preset data stored in the storage unit (30); and a temperature comparison step (S258) of comparing a detected temperature value ($t_h$) of the temperature sensor (57) with a preset pressure value ($t_{hs}$) of the preset data stored in the storage unit (30).

31. The control method of a semiconductor chip delamination device according to claim 23, wherein the delaminating step (S30) includes:

a delaminating unit movement step (S31) of allowing the delaminating unit to be moved to peel off, from the semiconductor chip, the delamination seal disposed to cover the semiconductor chip having the protective film disposed on one surface thereof; a delaminating unit peeler blade pressure detection step (S33) of detecting a pressure applied to the delaminating unit peeler blade (720);

a pressure uniformity confirmation step (S35) of comparing the pressure detected in the delaminating unit peeler blade pressure detection step (S33) with a preset pressure value of the preset data stored in the storage unit (30); and a pressure correction step (S37) of regulating a pressure applied to the delaminating unit peeler blade.

32. The control method of a semiconductor chip delamination device according to claim 23, wherein the semiconductor chip delamination device (10) further includes a UV irradiator (800), and further including, after the covering step (S20), a UV irradiating step (S40) that is executed between the covering step (S20) and the delaminating step (S30), and irradiates an ultraviolet ray onto the delamination seal disposed to cover the semiconductor chip having the protective film disposed on one surface thereof.

33. The control method of a semiconductor chip delamination device according to claim 23, further including, after the delaminating step (S30), a cleaning step (S50) of cleaning one surface of the semiconductor chip from which the delamination seal for allowing the protective film in a melting contact state to be separated from the semiconductor chip is peeled off.

* * * * *